US012607804B2

(12) United States Patent
Shindo et al.

(10) Patent No.: US 12,607,804 B2
(45) Date of Patent: Apr. 21, 2026

(54) OPTICAL CIRCUIT

(71) Applicant: NTT, Inc., Tokyo (JP)

(72) Inventors: Takahiko Shindo, Musashino (JP);
Meishin Chin, Musashino (JP);
Shigeru Kanazawa, Musashino (JP);
Yasuhiko Nakanishi, Musashino (JP)

(73) Assignee: NTT, Inc., Tokyo (JP)

( * ) Notice: Subject to any disclaimer, the term of this
patent is extended or adjusted under 35
U.S.C. 154(b) by 287 days.

(21) Appl. No.: 18/556,055

(22) PCT Filed: May 18, 2021

(86) PCT No.: PCT/JP2021/018874
§ 371 (c)(1),
(2) Date: Oct. 18, 2023

(87) PCT Pub. No.: WO2022/244121
PCT Pub. Date: Nov. 24, 2022

(65) Prior Publication Data
US 2024/0210623 A1     Jun. 27, 2024

(51) Int. Cl.
G02B 6/125      (2006.01)
H01S 5/026      (2006.01)
H01S 5/12       (2021.01)
H01S 5/16       (2006.01)

(52) U.S. Cl.
CPC ............ G02B 6/125 (2013.01); H01S 5/0265
(2013.01); H01S 5/12 (2013.01); H01S 5/16
(2013.01)

(58) Field of Classification Search
CPC ....................................................... G02B 6/125
See application file for complete search history.

(56) References Cited

U.S. PATENT DOCUMENTS 10,643,641  B1 *   5/2020  Ouyang ................. G11B 5/012
2008/0175549  A1   7/2008  Uetake et al.
2022/0239066  A1   7/2022  Fujihara et al.

FOREIGN PATENT DOCUMENTS

JP      2008-177405  A       7/2008
JP       2009246241  A   *  10/2009   ............... H01S 5/50
WO     2020/255183  A1     12/2020

OTHER PUBLICATIONS

Wataru Kobayashi et al., *Novel Approach for Chirp and Output
Power Compensation Applied to a 40-Gbit/s EADFB Laser Inte-
grated with a Short SOA*, Optics Express, vol. 23, No. 7, Apr. 6,
2015, pp. 9533-9542.

* cited by examiner

*Primary Examiner* — Charlie Y Peng
(74) *Attorney, Agent, or Firm* — Workman Nydegger

(57)     ABSTRACT

The optical circuit of the present disclosure provides a new
optical transmitter configuration that achieves both high
output and high quality transmission characteristics regard-
less of variations at cleavage positions. The optical circuit of
the present disclosure may be an optical transmitter having
an AXEL configuration in which an EADFB laser and a
semiconductor optical amplifier (SOA) are integrated. In a
window structure portion of a chip emission edge face of the
AXEL, a partially thickened bulk semiconductor layer is
formed by a structure including a simulated mesa configured
to be separated from an optical axis parallel to an optical axis
of an emission optical waveguide.

7 Claims, 20 Drawing Sheets

OPTICAL CIRCUIT

TECHNICAL FIELD

The present invention relates to an optical circuit, and more specifically, to an optical transmitter.

BACKGROUND ART

With the recent spread of video distribution services and the increasing demand for mobile traffic, network traffic is drastically increasing. In an optical transmission path that supports a network, a network cost reduction through an increase in transmission rate, a reduction in power consumption, and an extension of a transmission distance, have become a trend. Also for a semiconductor modulated light source, it is required to achieve high speed and high output while suppressing an increase in power consumption. Distributed feedback (DFB) lasers (hereinafter referred to as EADFB lasers) in which electro-absorption (EA) modulators (EA modulators) are integrated have excellent extinction characteristics and excellent chirp characteristics as compared with direct modulation lasers, and have been used in a wide range of applications.

FIG. 1 is a diagram illustrating a schematic configuration of a general EADFB laser. An integrated EADFB laser 40 has a structure in which a DFB laser 10 and an EA modulator 20 are integrated on the same chip. The DFB laser 10 has an active layer 1 including a multiple quantum well (MQW) and oscillates at a single wavelength by a diffraction grating 3 formed in a resonator. Meanwhile, the EA modulator 20 includes a light absorption layer 2 formed with an MQW having a composition different from that of a DFB laser, and changes the light absorption amount of a light absorption layer 2 through voltage control by a modulated signal source 12. The EA modulator 20 is driven under the condition that the output light from the DFB laser 10 is transmitted or absorbed to be made to blink, and converts an electrical signal into a modulated optical signal 4.

One problem of the EADFB laser is that it is difficult to increase the output because the EA modulator has a large optical loss. As a solution for higher output, an EADFB laser (SOA assisted extended reach EADFB laser: AXEL) in which a semiconductor optical amplifier (SOA) is further integrated at a light emission end of the EADFB laser has been proposed (Non Patent Literature 1).

FIG. 2 is a view illustrating a schematic configuration of an AXEL in which an EADFB laser and an SOA are integrated. In an AXEL 45, the signal light modulated by the EA modulator 20 is amplified by an integrated SOA region 30 to obtain the signal light 4. The AXEL 45 provides approximately 2 times higher power than a general EADFB laser. Due to the high-efficiency operation due to the SOA integration effect, the power consumption can be reduced by 40% in the AXEL when the AXEL is driven under the operation conditions to obtain the same optical output as that of the general EADFB laser. In addition, the same MOW structure as that of the DFB laser is used as the active layer of the SOA of the AXEL. Therefore, it is not necessary to add a new regrowth process for the integration of the SOA region, and the AXEL can be made in the same manufacturing process as the conventional EADFB laser.

A problem in the AXEL is deterioration of operation characteristics due to reflected return light due to high light output characteristics associated with SOA integration. In an optical transmitter such as a general semiconductor laser, the reflected return light reflected by an edge face of a semiconductor chip toward the inside of the chip adversely affects operation characteristics of a device. In order to deal with the reflected return light, in the semiconductor optical transmitter, by applying an anti-reflection film (AR) coating to the chip edge face, the reflected return light from the chip edge face to the inside is generally suppressed to 0.1% or less. However, in the case of the EADFB laser (AXEL) in which the SOA is integrated, even a small amount of reflected return light greatly affects the operation characteristics due to the high output.

A case where the optical amplification effect (gain) by the SOA of the AXEL is +3 dB with respect to the conventional single EADFB laser will be considered as a specific example. In the AXEL, since the average light output is increased by 3 dB by the integration of the SOA, the absolute value of the reflected return light intensity also increases by 3 dB. In addition, the reflected return light at the chip edge face again propagates in the SOA in the reverse direction and is amplified. Therefore, the reflected return light intensity reaching the DFB laser unit 10 in the AXEL of FIG. 2 is increased by 6 dB as compared with the single EADFB laser. As a countermeasure against reflected return light due to the high output of the AXEL described above, a structure in which a window structure portion and a bent waveguide are combined is adopted in addition to the AR coating.

FIG. 3 is a diagram illustrating a configuration for reducing an influence of reflected return light in the AXEL. FIG. 3 is an enlarged top view of the vicinity of an output edge face 55 of an AXEL semiconductor chip 50. To be precise, FIG. 3 is a cross-sectional view of the inside of the AXEL chip taken along a plane that passes through the cores of optical waveguides 51 and 52 and is parallel to the substrate surface. Note that the top view in the following description of the present specification includes the case of a cross-sectional view. Usually, an emission edge face of a semiconductor chip is a crystal surface formed by cleavage, and a waveguide in the semiconductor chip is formed at an angle perpendicular to the emission edge face. Therefore, light propagating through the optical waveguide is perpendicularly incident on the emission surface and is emitted from the semiconductor chip.

On the other hand, in the chip structure of the AXEL illustrated in FIG. 3, the bent portion 52 is provided in the optical waveguide 51 in the chip, and light is incident at an incident angle inclined by an inclination angle 54 ($\theta_{wg}$) from the direction perpendicular to the emission edge face 55. By providing the inclination angle 54, the light reflected by the emission edge face 55 is hardly coupled to the waveguide again, and thus the reflected return light can be suppressed. In general, the inclination angle $\theta_{wg}$ with respect to the emission edge face of the waveguide for suppressing reflection is 4 to 8°.

Furthermore, in the chip structure of the AXEL illustrated in FIG. 3, the optical waveguide 51 passes through the bent portion 52 and terminates on the inner side of the emission edge face 55 of the chip 50. The light emitted from the optical waveguide propagates in a bulk semiconductor called a window region 53, then reaches the emission edge face 55, and is emitted to the outside of the chip. At this time, in the window region 53, the emitted light propagates while expanding the beam diameter due to the diffraction effect. The spread of the beam diameter can further reduce the proportion of the reflected return light reflected at the emission edge face 55 and coupled to the waveguide inside the chip again. The window region 53 is usually made to have a length of approximately 10 μm. In order to obtain high output characteristics and high quality transmission characteristics at the same time in the AXEL, it is necessary to sufficiently apply a countermeasure against reflected return light with the configuration as illustrated in FIG. 3.

CITATION LIST

Non Patent Literature

Non Patent Literature 1: W Kobayashi et al., "Novel approach for chirp and output power compensation applied to a 40-Gbit/s EADFB laser integrated with a short SOA," Opt. Express, Vol. 23, No. 7, pp. 9533-9542, April 2015

SUMMARY OF INVENTION

Technical Problem

However, the structure for reducing the influence of the reflected return light in the vicinity of the chip edge face in the AXEL described above has a problem of a decrease in chip yield due to manufacturing variation when the window structure portion is formed. The window structure portion formed at the light emission edge face is made by cleavage. In an actual cleavage process of a semiconductor chip, a cleavage position error of approximately +10 μm generally occurs. In the AXEL having the window structure portion, it is necessary to control the variation in cleavage position with sufficient accuracy in order to manufacture an optical transmitter having sufficient high output and high quality characteristics. In the current structure of the chip end portion of the AXEL, it is not possible to provide a sufficient margin for the cleavage position variation at the time of forming the emission edge face. Due to the manufacturing error of the cleavage position, a certain number of defective products are always generated in the chips of the AXEL, and the manufacturing yield is lowered. Similar problems can arise in other optical circuits that include cleavage in the manufacturing process and include window structure portions.

The present invention has been made in view of such a problem, and provides an optical circuit that realizes high output characteristics and high quality transmission characteristics regardless of variations in a cleavage process.

Solution to Problem

According to one aspect of the present invention, there is provided an optical circuit in which a semiconductor laser and a semiconductor optical amplifier (SOA) are integrated on a substrate, the optical circuit including: a waveguide optically connected to the SOA and terminating inside of the substrate from an edge face; and a window region through including a plurality of simulated mesas configured parallel to an optical axis from an end of the waveguide to the edge face and being buried by a bulk semiconductor except for the simulated waveguide, each of the plurality of simulated mesas being separated from the optical axis by a distance M, wherein light emitted from the end of the waveguide propagates to the edge face.

The semiconductor laser described above is a distributed feedback laser (DFB laser) in which an electric field absorption modulator is integrated, the optical circuit is an optical transmitter, and the waveguide can be a passive waveguide including a core layer having a band gap wavelength shorter than an oscillation wavelength of the DFB laser.

Advantageous Effects of Invention

High output characteristics and high quality transmission characteristics of an optical circuit, particularly an optical transmitter, are realized.

BRIEF DESCRIPTION OF DRAWINGS

FIG. 4 is a view for explaining a bar structure for making a window region on a device edge face.

FIG. 13 is a diagram illustrating a relationship between a propagation distance of light in a window region and a loss caused by diffraction.

DESCRIPTION OF EMBODIMENTS

Figure 1:
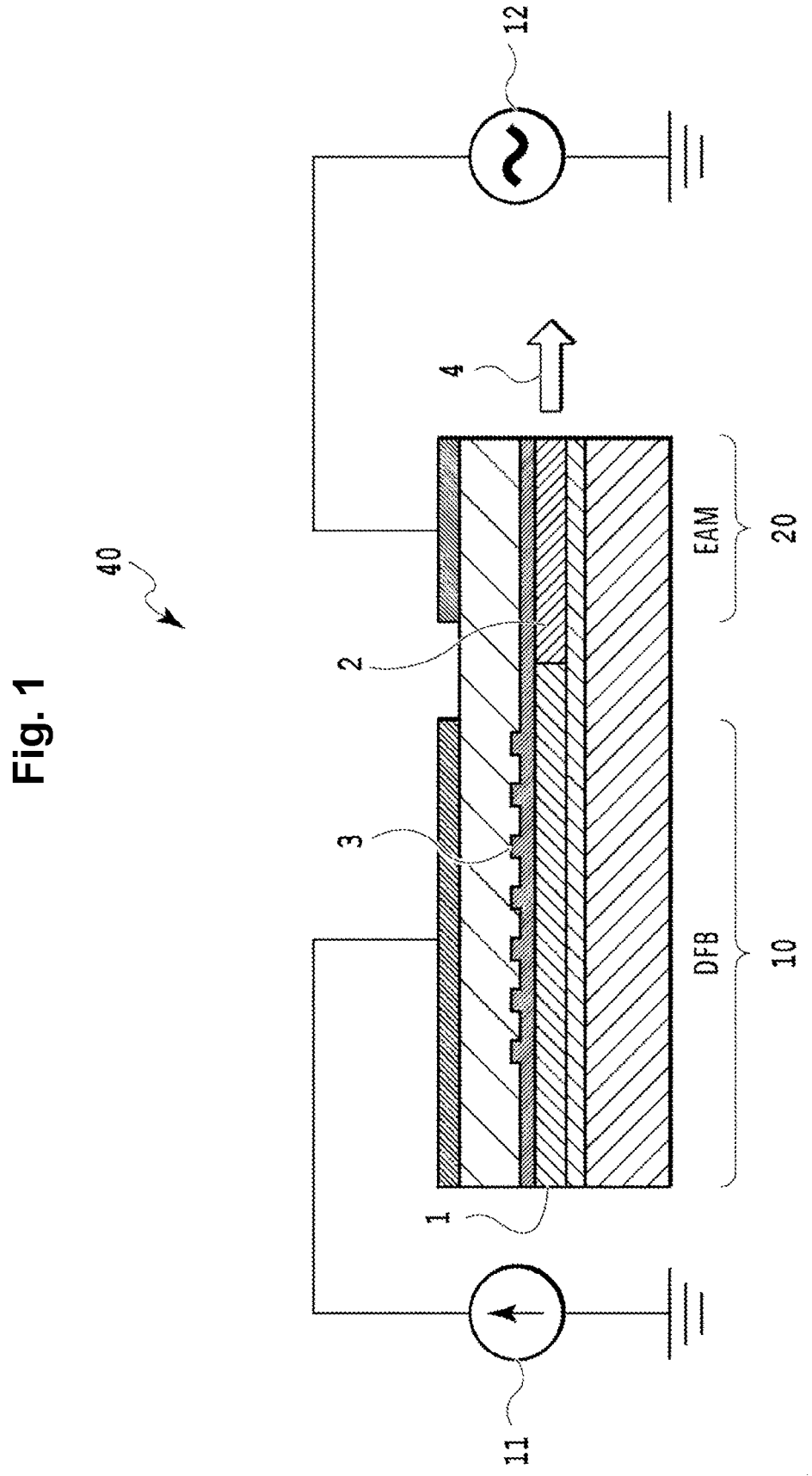
FIG. 1 is a diagram illustrating a schematic configuration of a general EADFB laser.

The optical circuit of the present disclosure provides a new optical transmitter configuration that achieves both high output and high quality transmission characteristics regardless of variations at cleavage positions. The optical circuit of the present disclosure may be an optical transmitter having an AXEL configuration in which an EADFB laser and a semiconductor optical amplifier (SOA) are integrated. In the window structure portion of the chip emission edge face of the AXEL, a partially thickened bulk semiconductor layer is formed by a structure including a simulated mesa configured parallel to the optical axis of the optical waveguide. Hereinafter, first, the influence of the variation at a cleavage position at the end portion of the chip on the characteristics of the AXEL will be described, and next, the configuration and operation of the optical circuit of the present disclosure will be described.

Hereinafter, in the description of the present specification, the term "AXEL" means an optical transmitter in which an EADFB laser and a semiconductor optical amplifier (SOA) are integrated, and is assumed to have the same meaning as "optical transmitter."

Figure 4:
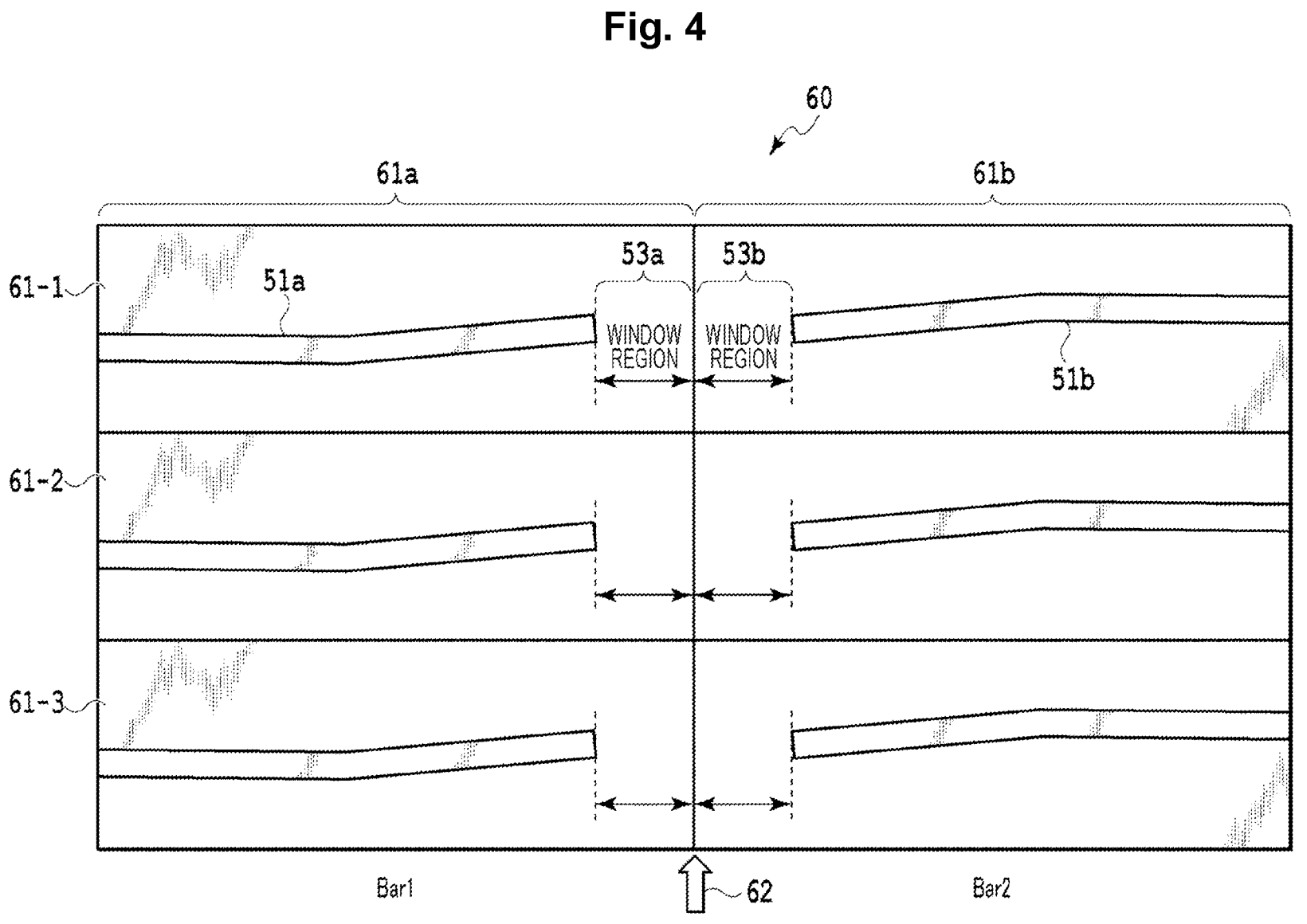

FIG. 4 is a view for explaining a bar structure for making a window region on a device edge face. In an optical semiconductor device such as a semiconductor laser, a plurality of chips having the same emission edge face are cleaved in a bar shape to form an emission edge face. By performing the cleavage process, a bar having a common cleavage surface and having a plurality of chips arranged along the cleavage surface is formed. The bars are further decoupled perpendicular to the cleavage surface into individual device chips. In addition, the adjacent bars are arranged such that the emission edge faces thereof face each other.

A semiconductor device 60 of FIG. 4 includes two bars 61a and 61b, and each bar includes three optical circuits 61-1 to 61-3. The chips facing each other have window structure portions 53a and 53b, respectively, and have ends of optical waveguides 51a and 51b at positions separated from a cleavage scheduled position 62 by a window region length L. The semiconductor device of FIG. 4 only illustrates the vicinity of the edge faces of individual chips, including the final cleavage scheduled position 62, with each chip illustrating a part of the AXEL.

In the cleavage process of the semiconductor chip, there is a limit to the accuracy of cleavage, and even when the cleavage scheduled position 62 in FIG. 4 is determined, the actual cleavage position varies to some extent. In a semiconductor chip having a window structure portion manufactured by cleavage, the window region length L varies depending on the chip. As described above, in the AXEL, the window region length is designed to be approximately 10 μm. Referring to FIG. 4, when an error of 10 μm or more occurs at the actual cleavage position with respect to the cleavage scheduled position 62, the window region of one of the two bars 61a and 61b disappears. When the window region disappears, the effect of suppressing the reflected return light becomes insufficient.

Figure 5:
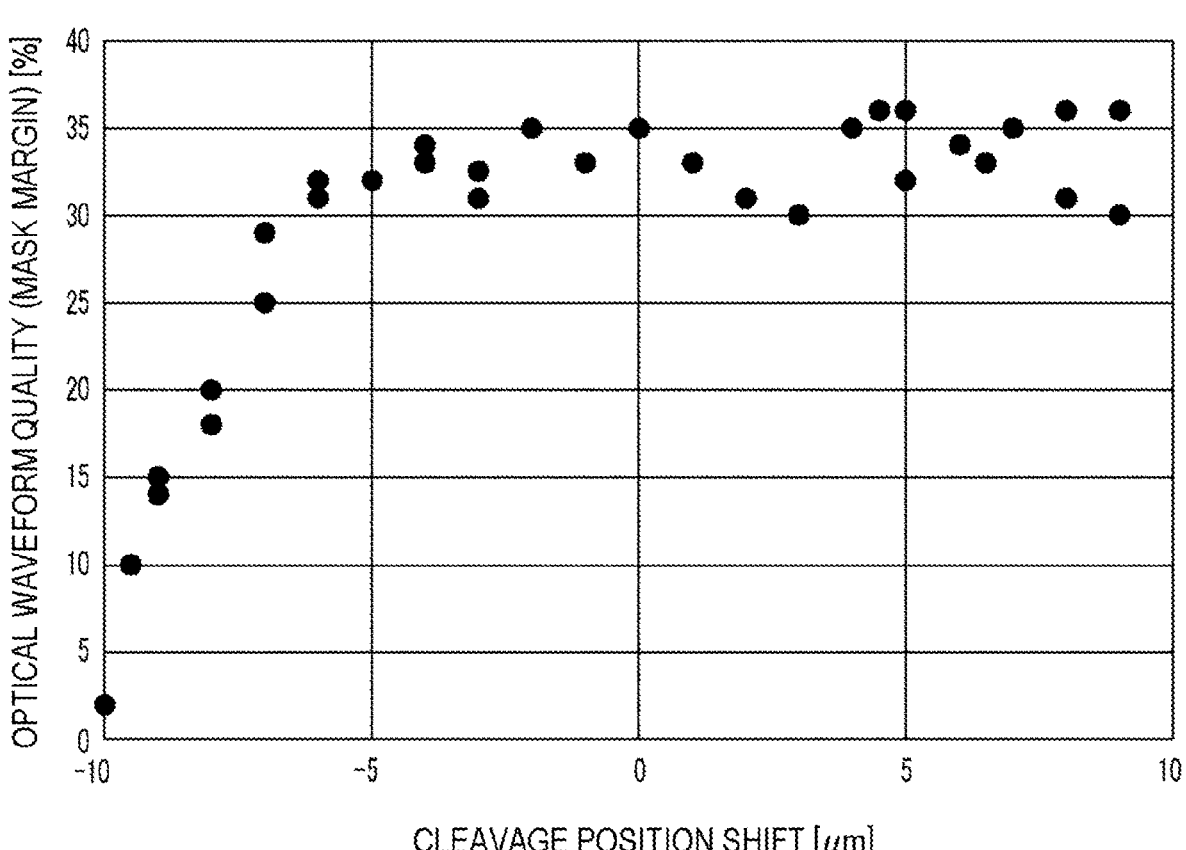
FIG. 5 is a diagram for explaining quality degradation of a transmission optical signal due to an error at a cleavage position.

FIG. 5 is a diagram for explaining quality degradation of a transmission optical signal due to an error at a cleavage position. A plurality of AXEL chips made in the same process are mounted on each module, and the results of evaluating the optical waveform quality of the transmission optical signal are illustrated in a graph. The horizontal axis indicates a shift amount (μm) of the actual cleavage position of the AXEL chip created by the manufacturing process including the cleavage process, and the vertical axis indicates the mask margin (%) of the transmission optical signal waveform from the optical transmitter module using the chip.

The plurality of AXEL chips made here are chips having the same structure with the oscillation wavelength in the 1.3 μm band, and the window region length L=10 μm is a design value, and only the varied window region length L caused by the manufacturing error is different between chips. Before each chip was assembled into a module, the window region length L was actually measured. After measuring L, each chip was mounted on a general butterfly semiconductor module configured with a two-lens system. A high frequency connector was mounted on the butterfly package, each of the modules made was modulated with a 25 Gbit/s NRZ signal, and an optical waveform (EYE waveform) of the transmission optical signal was evaluated. The mask margin on the vertical axis of the graph of FIG. 5 is a representative index representing the quality of the optical waveform, and the larger the margin value (%), the clearer the opening of the eye and the better the quality of the modulated signal.

As is apparent from the graph of FIG. 5, the mask margin is deteriorated as the cleavage position is shifted in the negative direction, that is, as the window region length L is reduced. This deterioration of the mask margin is considered because the reflected return light intensity from the chip edge face to the inside increases as the window region length L decreases, and the oscillation operation of the AXEL becomes unstable. From the relationship between the window region length (cleavage position shift amount) and the transmission optical signal quality illustrated in FIG. 5, it can be seen that the window region length L needs to be at least 5 μm or more. However, as described below, the window region length L has an upper limit, and even when the window region length L is extremely large, the device characteristics of the AXEL are adversely affected.

Figure 6:
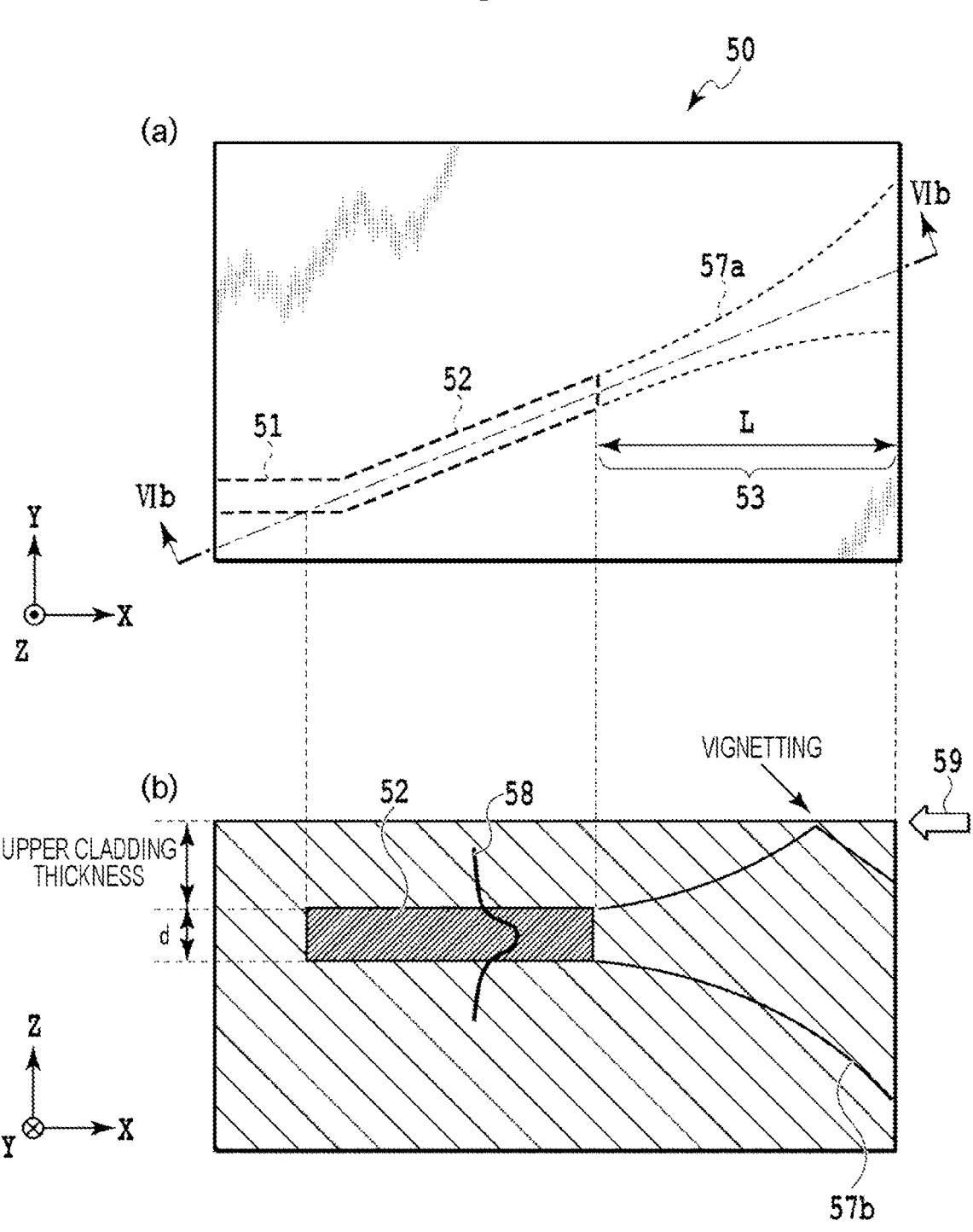
FIG. 6 is a view illustrating a light beam shape in the vicinity of the edge face when a window region length L is long.

FIG. 6 is a view illustrating a light beam shape in the vicinity of the emission edge face when the window region length L is long. FIG. 6(a) illustrates a top view of a substrate surface (x-y plane) viewed in the vicinity of the emission edge face of the AXEL chip 50, and FIG. 6(b) illustrates a cross-sectional view taken along line VIb-VIb and perpendicular to the substrate surface (x-y plane). In FIG. 6(a), it is assumed that the optical waveguide 51 inside the chip and the bent waveguide portion 52 at the tip end are visible. The light emitted from the bent waveguide portion 52 reaches the cleavage surface of the chip edge face as a beam 57a. A part from the end portion of the bent waveguide portion 52 to the cleavage surface is a window region 53 having the length L. Referring to FIG. 6(b), the light having a profile 58 emitted from the core having a height d of the bent waveguide portion 52 reaches the cleavage surface as a beam 57b.

In the optical transmitter in the communication wavelength band (C, L, O bands) of the 1.55 μm band or the 1.3 μm band, when the core material is InGaAsP, the thickness of the core layer is approximately 200 nm to 300 nm. Usually, in an InP-based optical semiconductor device, optical confinement in a waveguide vertical direction (z direction) is stronger than that in an optical waveguide horizontal direction (in an x-y plane). Therefore, the beam spread in the window region has a larger spread angle in the waveguide vertical direction. Therefore, when the length L of the window region 53 is long, the upper end of the beam 57b in the waveguide vertical direction (z direction) reaches an interface 59 between the cladding layer and the outside of the semiconductor (air or electrode). When a part of the beam reaches the interface 59 of the chip, a defect (vignetting) or an optical loss occurs in the beam shape. In the beams 57*a* and 57*b* illustrated in FIG. 6, for example, a part attenuated by a certain ratio (for example, ½) from the peak intensity of the beam center is illustrated as a beam edge. Therefore, light is also distributed outside the boundary of the beam 57*b* in FIG. 6(*b*), and light exceeding the interface 59 of the upper cladding layer having a thickness h is emitted and scattered to the outside of the chip.

In a general InP-based optical semiconductor device, a cladding layer on an optical waveguide is formed by regrowth, and the thickness h of the upper cladding layer is approximately 2 µm. As described in FIG. 6, in a case where the window structure portion is provided at the end portion of the chip, it is necessary to design the thickness h of the upper cladding layer in consideration of the beam spread in the waveguide vertical direction caused by the diffraction effect of the light beam. In the AXEL, the thickness of the upper cladding layer in the window region at the chip end portion is a problem. Therefore, first, a process of making the upper cladding layer in the AXEL is confirmed.

Figure 7:
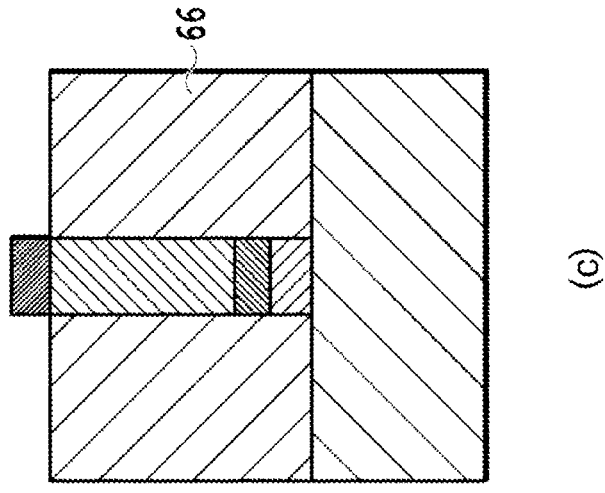
FIG. 7 is a view for explaining a process of making an upper cladding layer in the AXEL.
Figure 7:
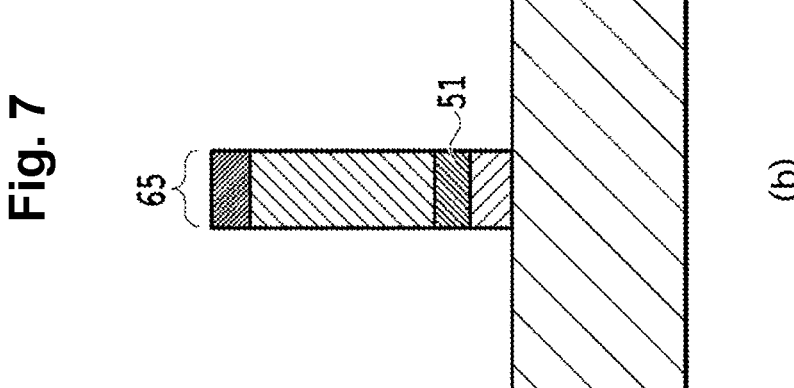
Figure 7:
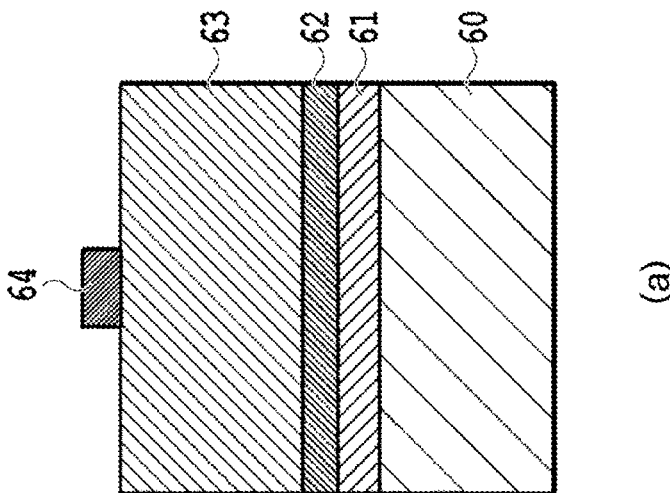

FIG. 7 is a view for explaining a part of the process of making the upper cladding layer in the AXEL. FIG. 7 illustrates a mask forming process in (a), a mesa forming process in FIG. (b), and a buried layer growing process in (c) in a cross-sectional view taken perpendicularly to the light traveling direction of the optical waveguide. As also illustrated in FIG. 6, in the window region 53, the optical waveguide is terminated at the bent portion 52 to become an InP region. InP in the window region 53 is formed at the same time during the upper cladding layer growth process or the burying growth process. In FIG. 7, a case where the window region 53 is formed at the time of InP burying growth will be described.

Figure 2:
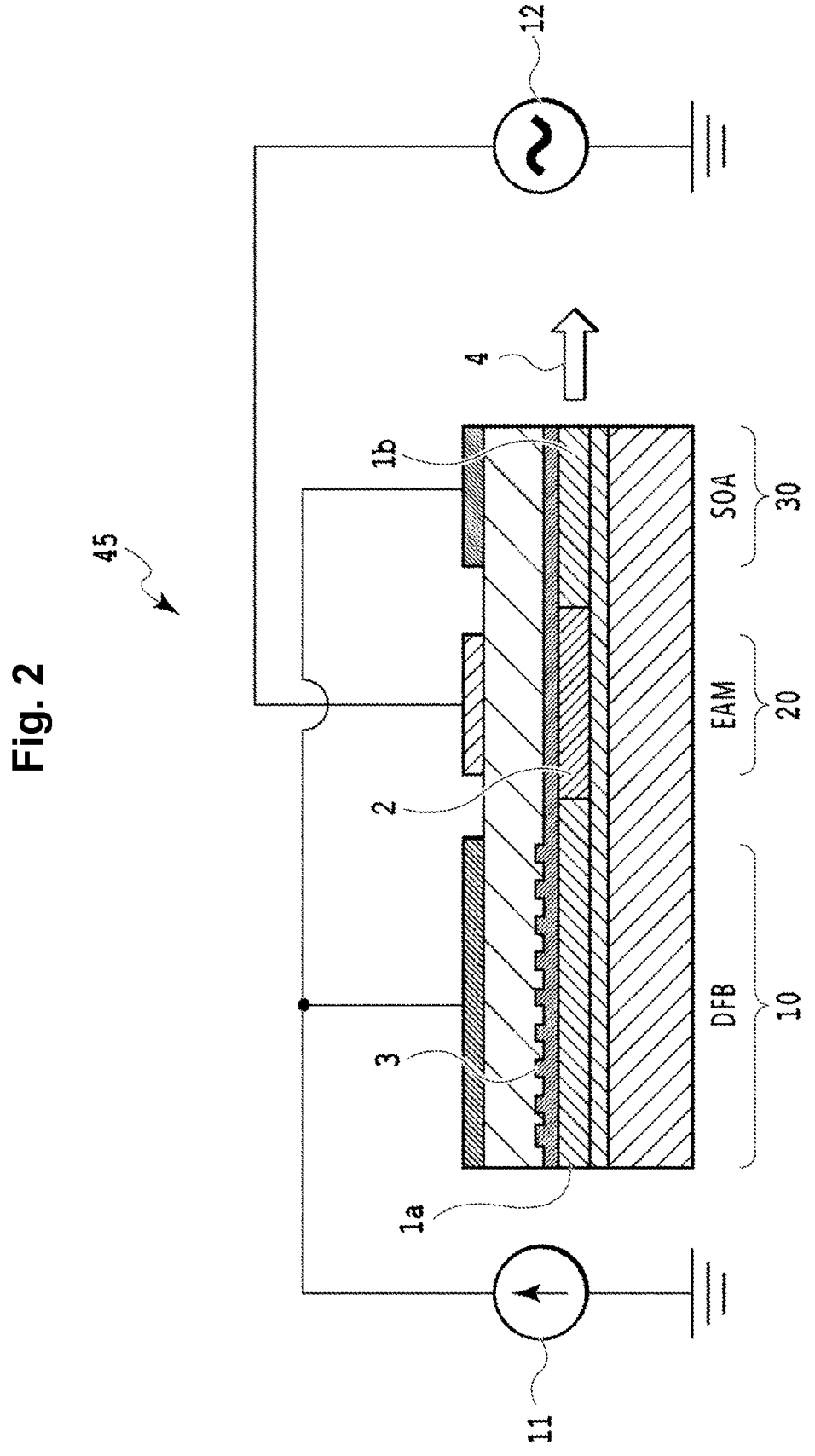
FIG. 2 is a diagram illustrating a schematic configuration of an AXEL in which an SOA is integrated into the EADFB laser.
Figure 3:
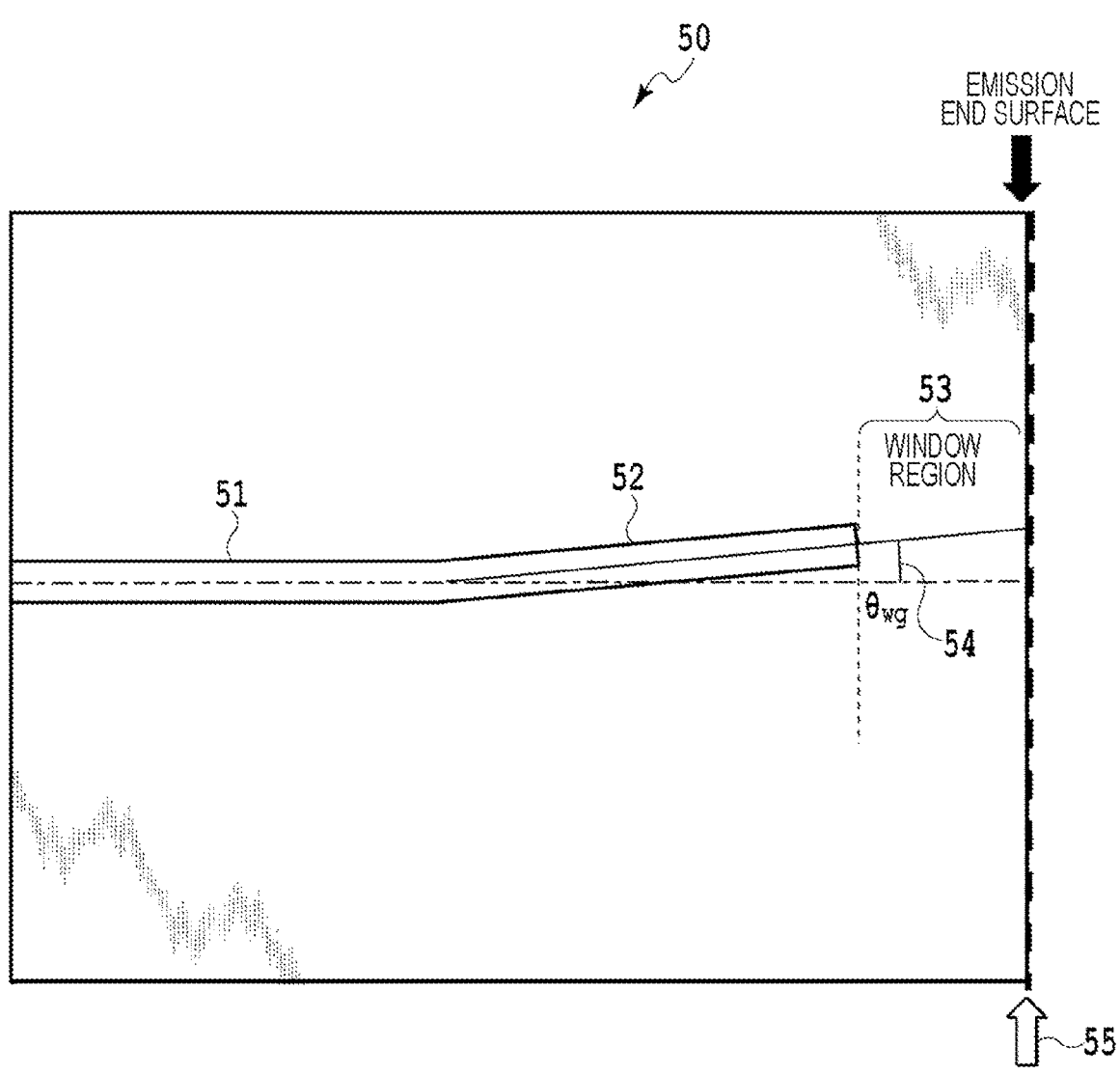
FIG. 3 is a diagram illustrating a configuration for reducing an influence of reflected return light in the AXEL.

As described with reference to FIG. 2, the AXEL waveguide has a common buried structure with a laser unit 10, an EA modulator unit 20, and an SOA unit 30. In order to make this waveguide structure, first, as shown in FIG. 7(*a*), an insulating film is formed on an initial substrate and patterned to form an insulating film mask 64 having a waveguide shape. The initial substrate is obtained by sequentially growing a substrate 60, a lower cladding layer 61, an active layer 62, and an upper cladding layer 63. Thereafter, as illustrated in FIG. 7(*b*), the mesa forming process is performed by dry etching or wet etching process to form a waveguide mesa portion 65. Subsequently, as illustrated in FIG. 7(*c*), an InP layer 66 functioning as a current block layer is regrown to bury the periphery of the waveguide mesa portion 65. Finally, the insulating film mask 64 is removed to complete a buried hetero (BH) structure. A window structure portion with a window region at the end portion of the chip is also formed at the same time when this BH structure is made. A problem in the window structure portion is that the thickness of InP in the window region is thinner than the thickness of InP in the upper cladding of the waveguide part, and particularly easily affects the optical field.

Figure 8:
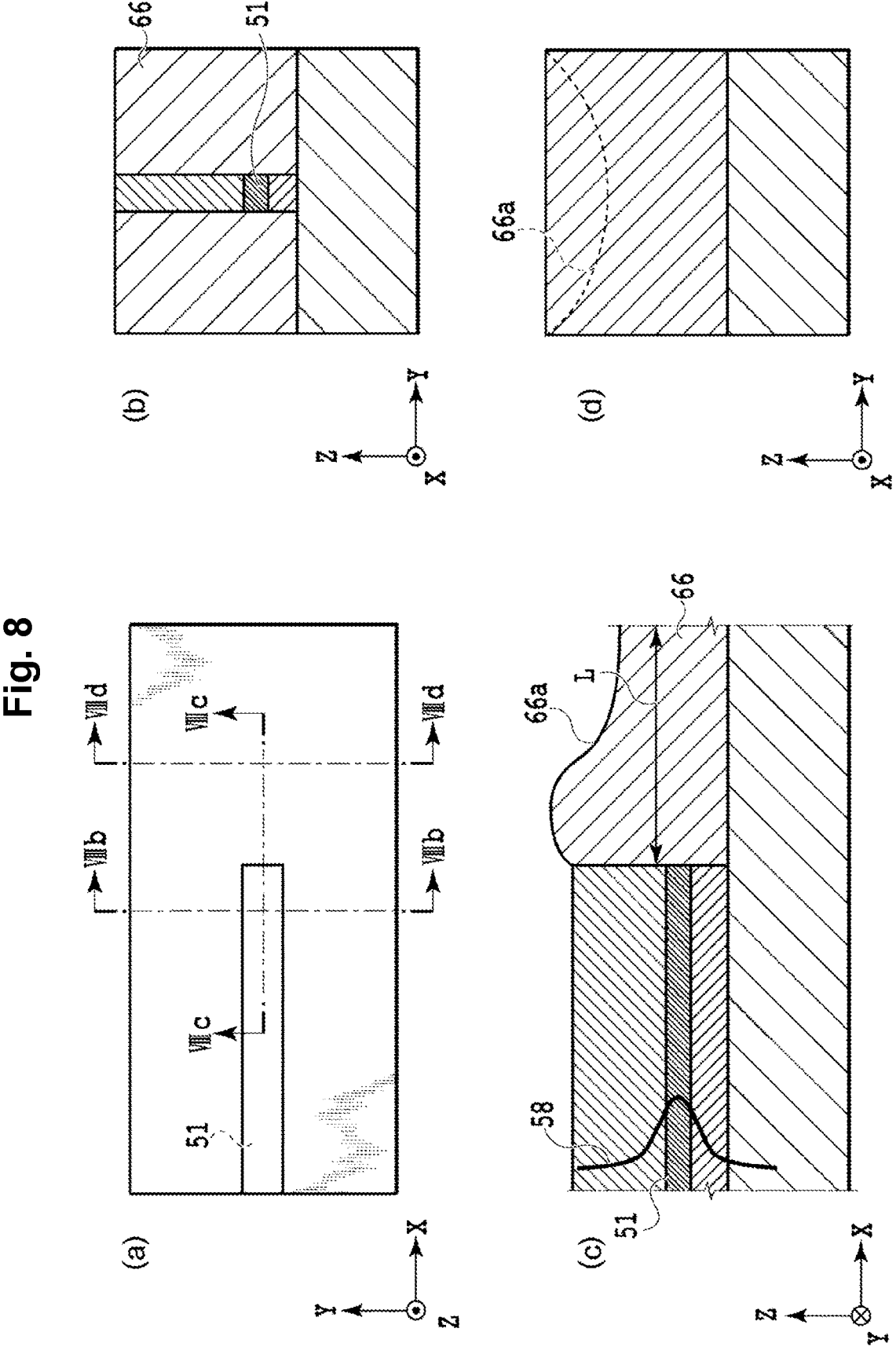
FIG. 8 is a diagram illustrating a schematic configuration of an AXEL having a window structure portion according to the related art.

FIG. 8 is a diagram illustrating a schematic configuration of an AXEL having a window structure portion according to the related art. FIG. 8 illustrates a schematic configuration of the vicinity of the emission edge face of the AXEL having the window structure portion formed by the burying regrowth. FIG. 8(*a*) is a view of the window structure portion of the AXEL as viewed from the substrate top surface direction, and is a cross section taken along an x-y plane including the center (optical axis) in the height direction of the optical waveguide 51 in FIG. 8(*c*). FIG. 8(*b*) is a cross-sectional view taken along a y-z plane including line VIIIb-VIIIb in FIG. 8(*a*) in the waveguide region of the AXEL, and FIG. 8(*d*) is a cross-sectional view taken along a y-z plane including line VIIId-VIIId in FIG. 8(*a*) in the window region. FIG. 8(*c*) is a cross-sectional view taken along an x-z plane including line VIIIc-VIIIc in FIG. 8(*a*) along the optical waveguide 51.

In order to simplify the description, FIG. 8 illustrates the linear waveguide 51 having no bent waveguide at the end. As illustrated in the cross-sectional view of the waveguide region in FIG. 8(*b*), the buried regrown InP 66 which is a current block layer is formed on both sides of the waveguide mesa, and the waveguide core has a structure in which the waveguide core is buried with the InP 66 which is the current block layer. In addition, as illustrated in FIGS. 8(*c*) and 8(*d*), the part serving as the window region of the length L is also etched at the same time as the making of the waveguide mesa, and the same InP layer as the current block layer 66 is buried in the process of the burying regrowth. In a normal burying regrowth process, the thickness of the InP layer to be regrown such that the mesa structure is completely buried is set according to the height of the waveguide mesa. This is because when the InP layer to be buried and regrown is made extremely thick as compared with the waveguide mesa, the InP layer 66 rides and is deposited on the insulating film 64 illustrated in the upper cladding layer making process of FIG. 7.

In contrast to the above-described waveguide region, since the window region is a part where the waveguide 51 is terminated and no mesa shape is present as illustrated in the top view of FIG. 8(*a*), the area and volume of a part serving as a base to be buried at the time of regrowth of the InP layer are larger. From the difference in the size of the region space to be buried, when InP is buried at the same time in the waveguide region and the window region in one regrowth process, an InP layer 66*a* in the window region becomes thinner than the InP layer 66 in the waveguide region as illustrated in FIG. 8(*c*). As described in the light beam shape of FIG. 6, in the window region, the optical field propagates while spreading due to the diffraction phenomenon, and the spread in the waveguide vertical direction is larger. When the InP film thickness is reduced in the window region, the optical field comes into contact with the interface between the InP film and air, and optical loss is likely to occur.

Figure 9:
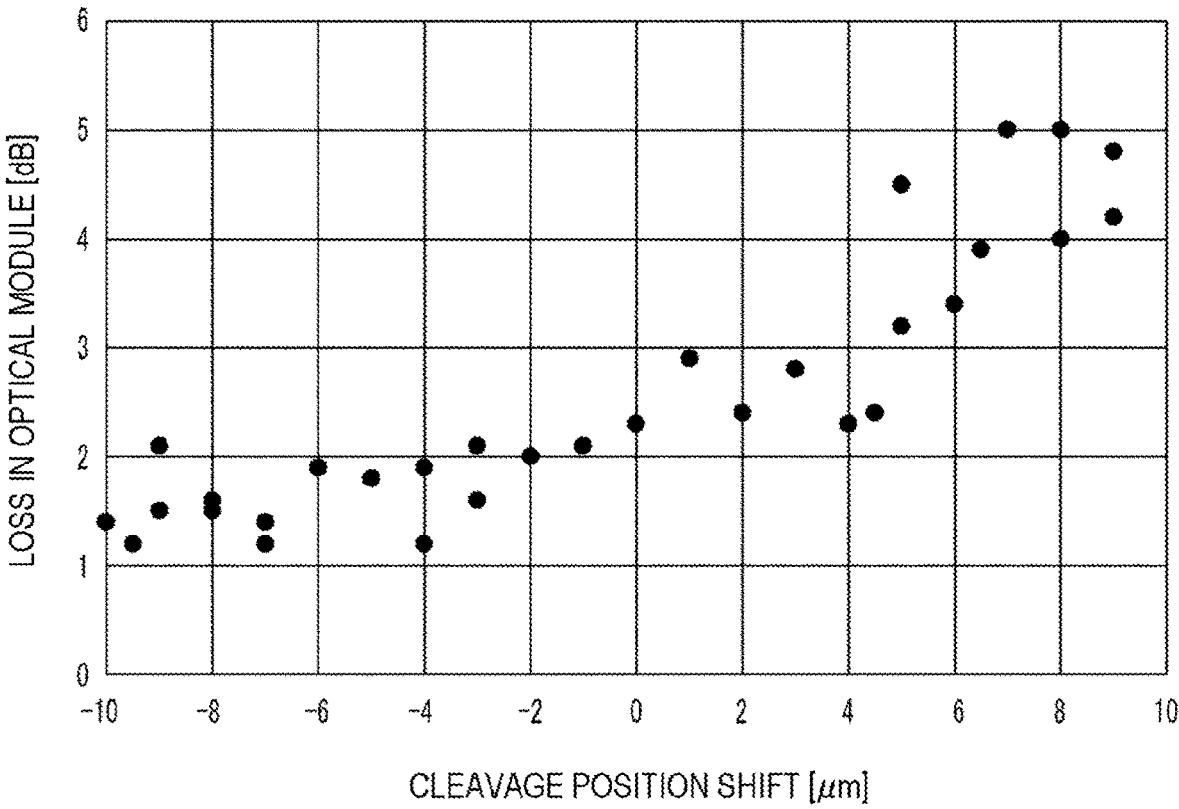
FIG. 9 is a diagram illustrating a relationship between cleavage position variation and loss in the AXEL having a conventional configuration.

FIG. 9 is a diagram illustrating the relationship between cleavage position variation and loss in the AXEL of the related art. Similarly to the evaluation of the mask margin in FIG. 5, for the AXEL chip made using the normal burying regrowth process, first, the shift amount of the cleavage position from the design value was measured. Using the AXEL chip of which the shift amount was measured, a plurality of AXEL modules were made, and the optical loss in the module was evaluated. In FIG. 9, the horizontal axis represents the shift amount (µm) of the cleavage position, and the vertical axis represents the loss (dB) generated in the optical module. The plot points in FIG. 9 correspond to the plot points at which the mask margin in FIG. 5 was evaluated. An AXEL chip having the same structure is used in each module, and a design value of the window region length L is 10 µm.

The loss in the optical module is obtained as follows from a difference between the optical output level of the chip alone and the optical output level in a state of being mounted on the module. For the optical output level of the chip alone before the module mounting, the light output intensity using a large-diameter photodetector was measured for each AXEL chip. Thereafter, the AXEL chip was mounted on an optical module, and the light output intensity coupled to the optical fiber was measured. The difference between the two light intensities can estimate the optical loss caused by the module mounting. The optical module used in this measurement had a two-lens system, and module mounting of the AXEL chip was performed by an active alignment process.

The relationship between the cleavage position variation and the loss in FIG. 9 indicates that the loss in the module tends to increase when the window region length L is longer than the design value (shift amount 0). As illustrated in FIG. 6, this loss increase is caused by the fact that the upper end of the output beam reaches the interface 59 between the cladding layer and the outside of the chip in the waveguide vertical direction due to the increase in the window region length L, and a loss occurs in the beam. A part of the beam that has reached the interface 59 becomes light emitted and scattered to the outside of the chip, and the coupling efficiency from the chip edge face to the optical fiber decreases, resulting in an increase in loss in the module.

From the relationship between the shift amount of the cleavage position and the loss illustrated in FIG. 9, in order to create an optical module in which the intra-module optical loss is 3.0 dB or less and the output level is stable, it is necessary to set the upper limit of the window region length L of the AXEL chip to 15 μm or less. That is, the shift amount of the cleavage position from the design value of 10 μm must be +5 μm or less. As described above, from the relationship between the window region length L and the transmission optical signal quality illustrated in FIG. 5, the window region length L needs to be at least 5 μm, and the shift amount of the cleavage position needs to be −5 μm or more. Then, the cleavage position needs to have an accuracy of +5 μm.

However, in the actual cleavage process of the semiconductor chip, an error of approximately +10 μm usually occurs at the cleavage position. In the AXEL having the window structure portion, it is not possible to provide a sufficient margin at the time of forming the emission edge face in manufacturing the optical transmitter having the sufficient quality of the transmission signal and the sufficient optical output level. As a result, the window region length deviates from the allowable value due to the manufacturing error of the cleavage position, a certain number of defective chips are generated, and the manufacturing yield is reduced.

As described above, the window region length L necessary for securing the required characteristics of the AXEL as an optical transmitter is in the range of 5 μm to 15 μm. The range of the window region length L is generally applicable as long as the core layer at the waveguide end is InGaAsP satisfying the band gap wavelength of 1.1 to 1.4 μm in the wavelength bands of the C band, the L band, and the 0 band.

The optical transmitter of the present disclosure presents a novel configuration for locally thickening the buried InP layer in the window region of the AXEL chip. By locally thickening the buried layer of the window region, the optical field can be propagated in the waveguide vertical direction without reaching the chip surface, and the optical loss in the window region in the chip can be reduced. Even when the window region length varies from chip to chip due to variation of the cleavage position, a stable optical output level and optical waveform quality are achieved, and the yield of the AXEL module is increased.

An optical transmitter of the present disclosure includes a plurality of "simulated mesa structures" at locations away from an optical axis in a window region in the vicinity of an emission edge face. By reducing the area of the semiconductor portion serving as a base for depositing the buried layer in the window region by the simulated mesa structure, the growth rate of InP at the time of regrowth is relatively increased, and the film can be made thicker than other regions on the wafer such as the waveguide region. Hereinafter, a configuration, a making method, and an effect of the optical transmitter of the present disclosure will be described with reference to the drawings.

Figure 10:
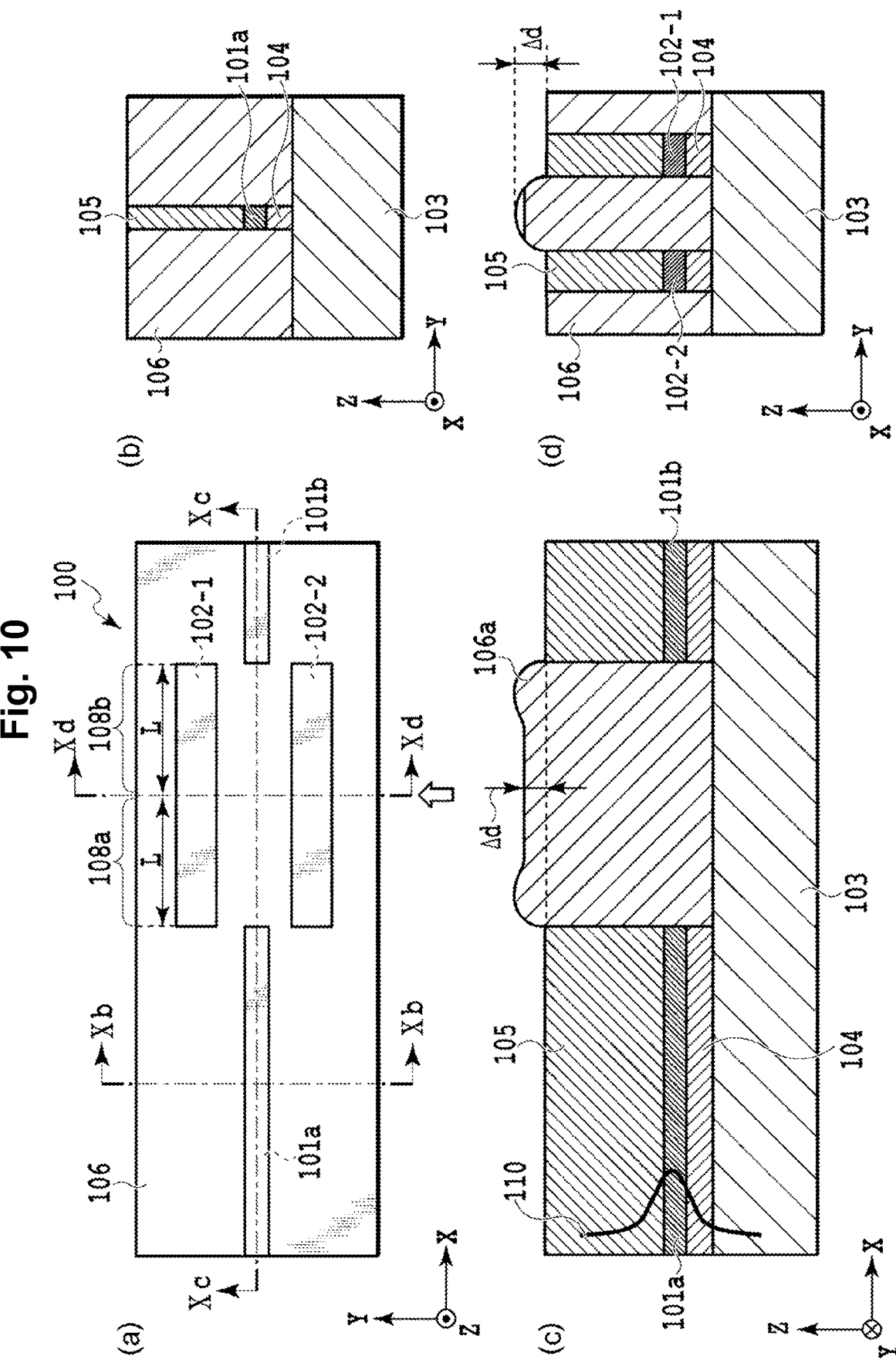
FIG. 10 is a view for explaining a schematic configuration of a window structure portion of an optical transmitter of the present disclosure.

FIG. 10 is a view for explaining a schematic configuration of a window structure portion of an optical transmitter of the present disclosure. FIG. 10 schematically illustrates vicinities of two window regions of an AXEL chip 100 in a state where two adjacent AXEL chips are arranged to face each other before cleavage as illustrated in FIG. 4. In FIG. 10, in order to simplify the description, a window structure in which light propagates from a waveguide having no bent portion at the tip end will be described. One window structure portion 108a is in contact with the window structure portion 108b of the adjacent chip, and the two window structure portions are cleaved to be separated to form one AXEL chip. FIG. 10(a) is a view of the window structure portion as viewed from above the substrate surface, and is a cross section taken along an x-y plane including line Xa-Xa in FIG. 10(c). FIG. 10(b) is a cross-sectional view taken along a y-z plane including line Xb-Xb in FIG. 10(a) in the waveguide region of the AXEL, and FIG. 10(d) is a cross-sectional view taken along a y-z plane including line Xd-Xd in FIG. 10(a) in the window region. FIG. 10(c) is a sectional view taken along optical waveguides 101a and 101b along an x-z plane including line Xc-Xc in FIG. 10(a).

The characteristic configuration of the optical transmitter of the present disclosure in FIG. 10 will be apparent from comparison with the drawings in FIG. 8 illustrating the corresponding configuration of the related art. Referring to FIG. 10(a), in the window region, the AXEL chip 100 includes simulated mesa structures 102-1 and 102-2 on the extension of the optical axis of the terminated waveguide 101a and at positions separated from the optical axis by an offset distance. Referring to FIGS. 10(b) and 10(d), the simulated mesa structure 102-1 and 102-2 have the same layer configuration as the mesa structure including the waveguide core. The window structure portion having the simulated mesa structure in FIG. 10 is the window structure portion in the AXEL of the related art shown in FIG. 8, and is in contrast to the case where there is nothing other than the InP buried layer up to the cleavage surface of the window region. The simulated mesa structure is merely a structure having no function of optical signal processing in the AXEL. Therefore, in the present specification, the simulated mesa structure can also be referred to as a "dummy mesa." In addition, since the simulated mesa structure has a mesa structure having the same layer configuration as the waveguide mesa including the waveguide core, the simulated mesa structure can also be referred to as a "simulated waveguide." As can be easily understood from FIG. 10, the simulated mesa structures 102-1 and 102-2 can be made at the same time with the process of making the mesa of the waveguide 101a.

Therefore, the optical circuit of the present disclosure in which a semiconductor laser and a semiconductor optical amplifier (SOA) are integrated on the substrate 103, includes: the waveguide 101 being optically connected to the SOA and terminating inside of the substrate from an edge face; and a window region, which is the window region 108 through which light emitted from an end of the waveguide propagates to the edge face, including the plurality of simulated mesas 102-1 and 102-2 configured parallel to the optical axis of the light from the end to the edge face and being buried by a bulk semiconductors 106 and 106a except for the simulated mesa, each of the plurality of simulated mesas being separated from the optical axis by the distance M.

By forming the simulated mesa structures 102-1 and 102-2, the area and volume of the region serving as the base where the InP layer is deposited in the window region at the time of burying regrowth are reduced as compared with the AXEL of the related art. As described in the InP burying regrowth process of FIG. 7, the regrowth is performed in a state where the insulating film mask 64 is provided on the waveguide mesa part 64, and accordingly InP is formed on the semiconductor exposed part other than the mesa part, and the waveguide mesa is buried.

Similarly, in the regions 101-1 and 101-2 of the simulated mesa structure of FIG. 10, the regrowth is performed by the insulating film mask in a state where the upper portion of the simulated mesa is protected by the insulating mask. As a result, in the window region, the InP layer is selectively grown only in the semiconductor exposed portion excluding the simulated mesa structure. By disposing the simulated mesa structure, in the window region, a semiconductor exposed part serving as a base on which the InP layer is deposited, that is, an exposed area of the substrate 103 before the regrowth process (FIG. 7(b)) is reduced. It can be understood that the space of InP to be buried in the InP deposition process also becomes relatively small. As a result, in the window region, the InP growth rate of the semiconductor exposed part excluding the simulated mesa structure relatively increases, and the InP film thickness in the vicinity of the simulated mesa increases. In particular, in the window region part between the two simulated mesa structures 102-1 and 102-2, InP thicker than the periphery of the normal waveguide mesa part is formed. In FIGS. 10(c) and 10(d), in the window region on the extension line of the optical axis of the waveguide 101a sandwiched between the two simulated mesa structures, the InP film is deposited thicker and has the bulged profile 106a as compared with the InP layer 106 around the waveguide mesa.

By thickening the InP buried layer in the window region, the optical field emitted from the end of the waveguide and propagating while diffracting in the window region is less likely to be in contact with the interface between the semiconductor and air on the upper side, and the optical loss is reduced. In other words, the window region length L can be designed to be long without increasing the optical loss, and a sufficient margin can be provided for the cleavage position shift. In the window region starting from the end position of the waveguide 101a, the simulated mesa structure is arranged at a position sufficiently away from the optical axis such that the optical field is not affected. Therefore, even when the simulated mesa structure is provided, there is no influence on the output beam.

Figure 11:
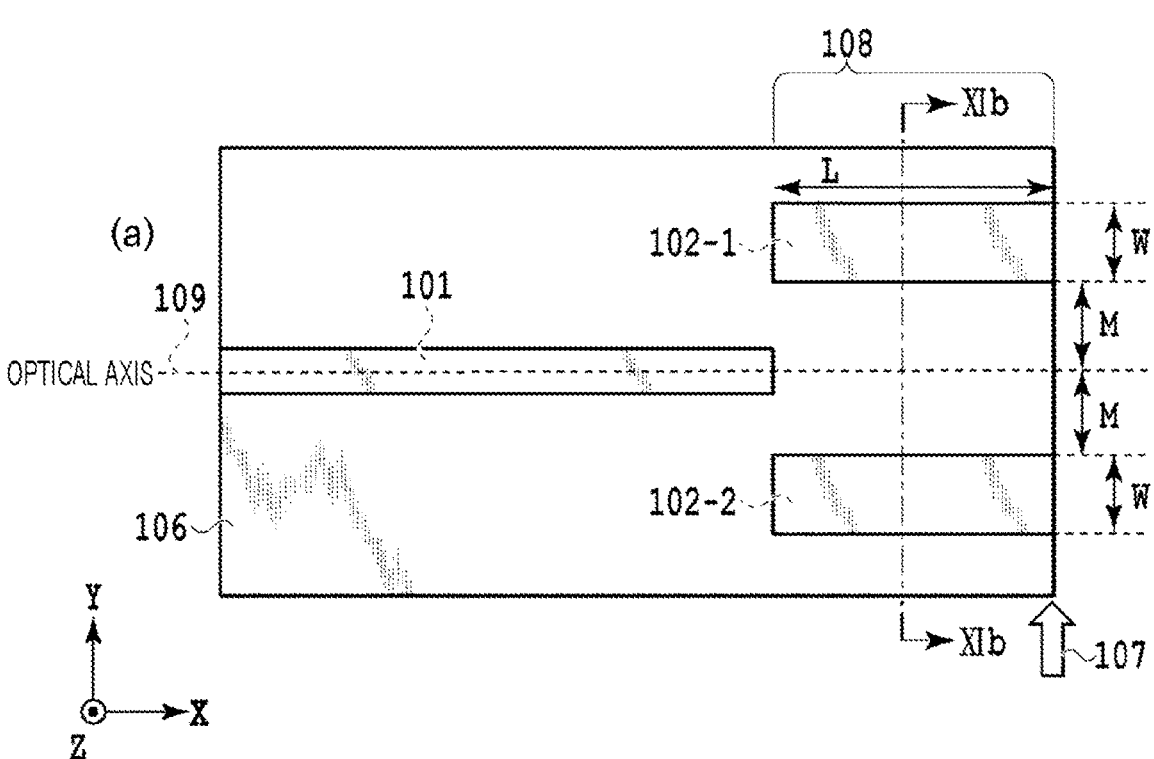
FIG. 11 is a view illustrating a configuration of a window structure portion after cleavage of the optical transmitter of the present disclosure.
Figure 11:
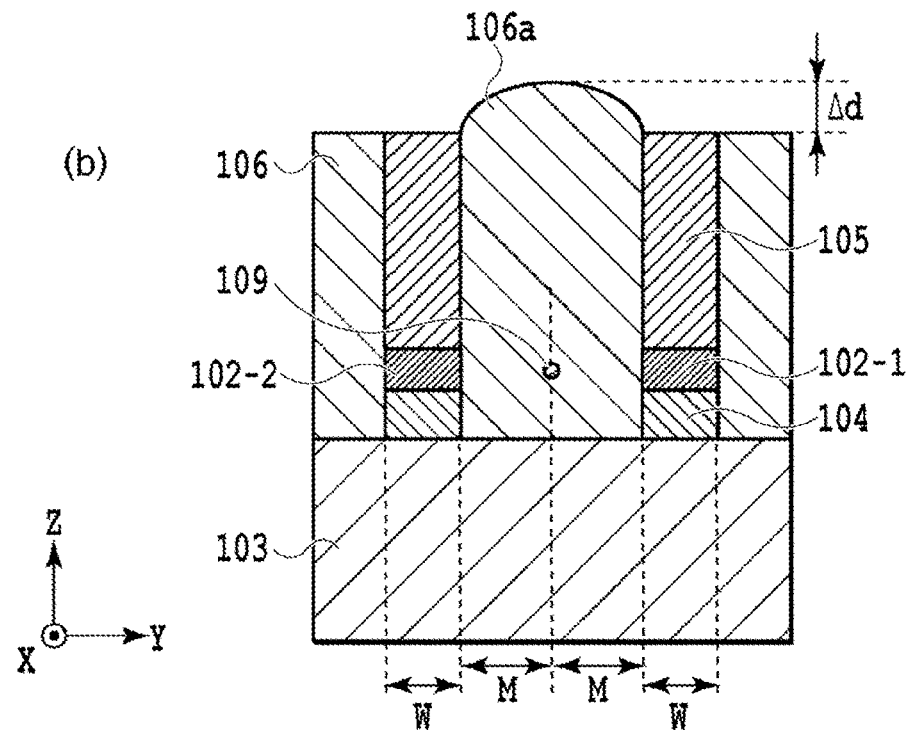

FIG. 11 is a view illustrating a configuration of a window structure portion after cleavage of the optical transmitter of the present disclosure, illustrating an AXEL chip on which an emission edge face is formed after a cleavage process is performed. FIG. 11(a) is a view of the substrate surface, and is a cross-sectional view taken along a plane parallel to the substrate surface passing through the core. FIG. 11(b) is a cross-sectional view taken along a y-z plane including line XIb-XIb in FIG. 11(a) in the waveguide region of the AXEL. After the chip 100 before cleavage illustrated in FIG. 10 is cleaved, one AXEL chip is separated.

In order to thicken the InP layer without affecting light propagating through the window region by the simulated mesa structure, it is desirable to arrange simulated mesas having the same shape symmetrically with respect to the optical axis along the optical axis in the window region. Referring to FIG. 11, the length of the window region is defined as L, the widths of the simulated mesa structures 102-1 and 102-2 are defined as W, and the distance (position) from the optical axis 109 to the end portion of the simulated mesa structure is defined as M. It is assumed that the simulated mesa structure is formed from the end portion of the waveguide to the cleavage surface along the optical axis 1090, and is L which is the same as the window region length. Here, the change in the InP film thickness generated between the two simulated mesa structures was examined using the position M and the width W of the end portion of the simulated mesa structure with reference to the optical axis as parameters. The upper portions of the simulated mesa structures 102-1 and 102-2 are set as reference heights, and the thickening amount Δd from the reference height of the InP film thickness immediately above the optical axis was experimentally confirmed.

Figure 12:
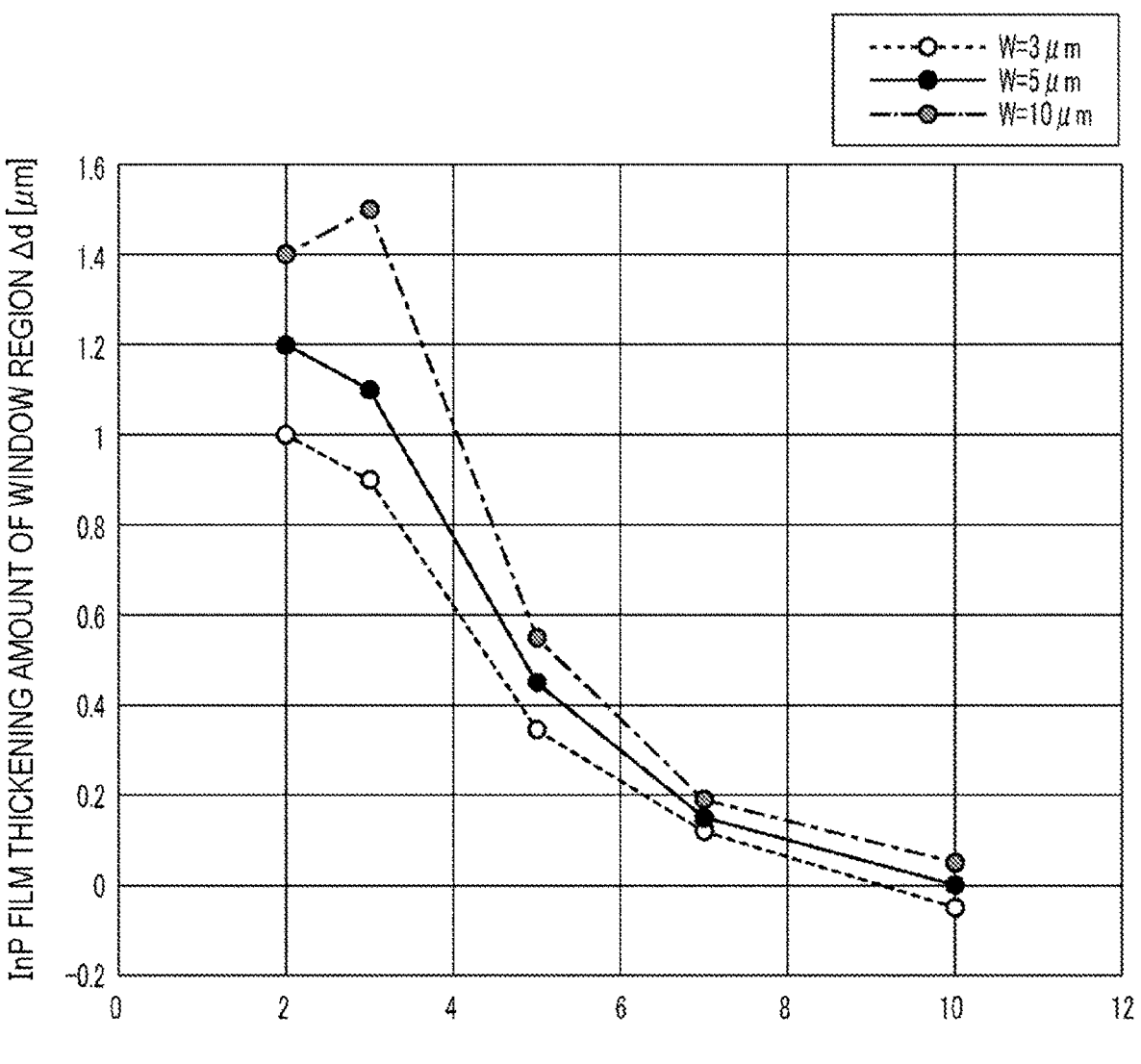
FIG. 12 is a diagram illustrating a relationship between a simulated mesa position from an optical axis and an amount of InP to be thickened.

FIG. 12 is a diagram illustrating a relationship between a simulated mesa position from an optical axis and an amount of InP to be thickened. Samples of a plurality of simulated mesa structures having different configurations were prepared on the same substrate, and the position M from the optical axis to the simulated mesa and the thickening amount Δd were plotted with the simulated mesa width W as a parameter. Burying regrowth was performed at the same time on all samples with an InP growth amount in which a waveguide with a mesa height of 4 μm was completely buried, which is the same as in normal AXEL making. In the plurality of samples, the simulated mesa position M from the optical axis was changed by 2 to 10 μm. As a parameter, the width W of the simulated mesa structure is plotted with respect to three types of 3, 5, and 10 μm.

As is apparent from the graph of FIG. 12, the InP film in the window region can be thickened by narrowing the distance M between the simulated mesa structure and the optical axis or widening the width W of the simulated mesa structure. In practice, when the position M of the simulated mesa from the optical axis is 2 μm, the regrown InP rides on the simulated mesa structure regardless of the width W of the simulated mesa structure, and the growth film thickness is not stable. When the position M of the simulated mesa from the optical axis was 7 μm, only a thickening amount Δd of 200 nm or less was obtained, and a practical effect was not obtained. From the results of FIG. 12, it has been found that the simulated mesa position from the optical axis at which a practical and sufficient effect can be obtained is approximately M=2 to 6 μm. By using the simulated mesa structure of the optical transmitter of the present disclosure, the InP film of the window structure portion can be thickened by approximately 1.5 μm at the maximum. As for the width W of the simulated mesa structure, it has been found that as the width W is increased, the effect of increasing the thickness is obtained, and the effect sufficient for increasing the thickness is exhibited even in the case of W=3 μm, which is the smallest.

Figure 13:
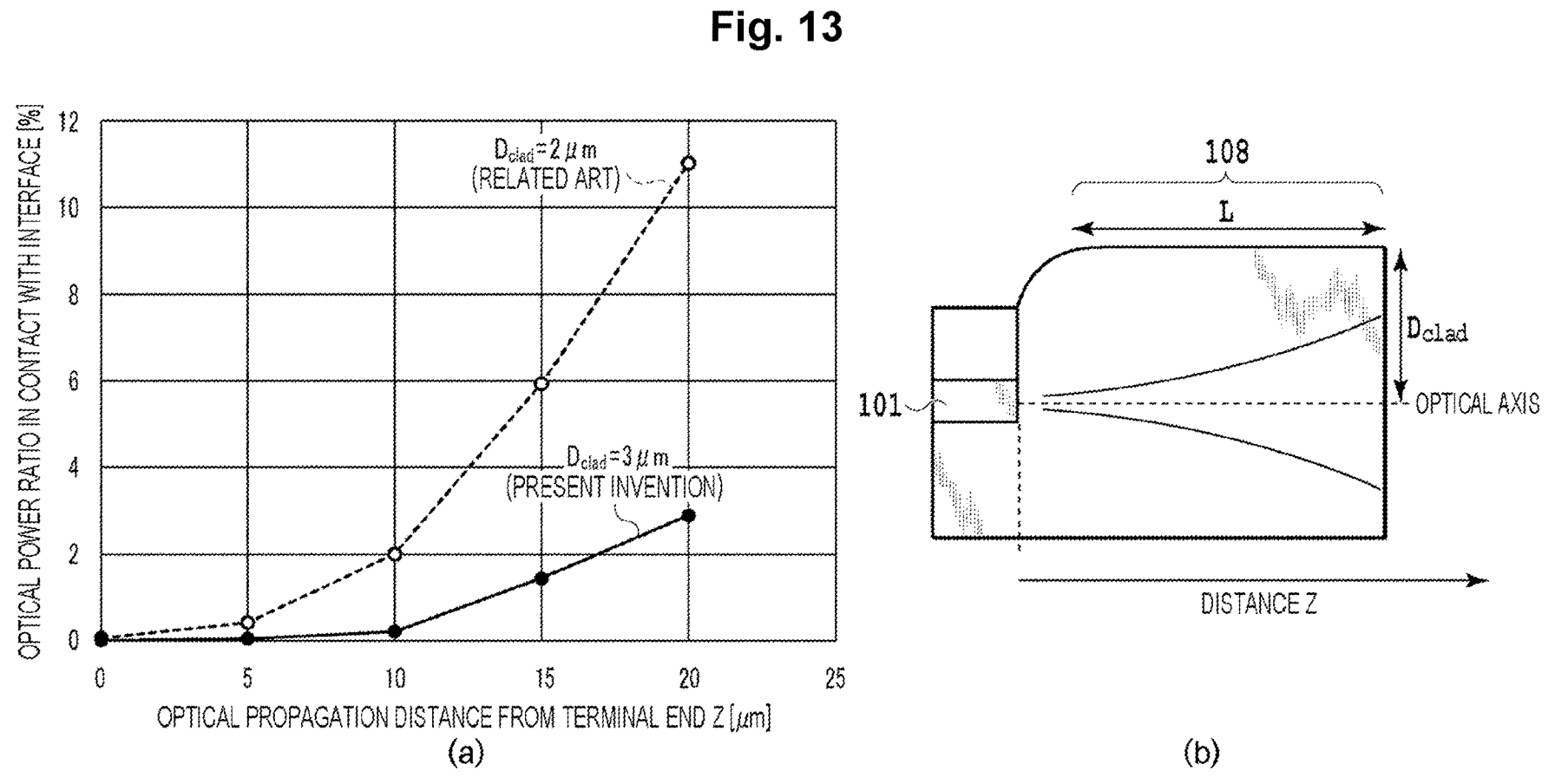

FIG. 13 is a diagram illustrating a relationship between a propagation distance of light in a window region and an optical loss caused by diffraction. For the window regions having different buried InP film thicknesses, the beam divergence amount in the vertical direction due to diffraction when light propagates was calculated as illustrated in the schematic diagram on the right side of FIG. 13. The horizontal axis indicates a distance Z at which light propagates from the waveguide end in the window region 108 having the length L, and the vertical axis indicates the optical power ratio (%) in contact with the interface between the InP buried layer and the upper air. In FIG. 13, as an example of the window structure portion of the related art, in a case where an upper cladding layer thickness $D_{clad}$ based on the center height of the core layer is 2 μm, a case where an upper cladding layer thickness $D_{clad}$ is thickened to 3 μm by the simulated mesa structure of the present disclosure is compared.

In the window structure portion of the related art, when light propagates through the window region by the distance Z of approximately 15 μm, approximately 6% of optical power in the optical field is brought into contact with the upper cladding layer interface to cause optical loss. On the other hand, in the window structure portion of the InP buried layer thickened by the simulated mesa structure in the optical transmitter of the present disclosure, the optical power ratio of the optical field in contact with the upper cladding layer interface is approximately 3% even when the light propagates through the window region by 20 μm. As compared with the configuration of the related art, the optical power ratio of the light in contact with the interface is half or less, and the loss can be sufficiently reduced. That is, by using the simulated mesa structure of the optical transmitter of the present disclosure, the optical loss can be sufficiently suppressed even in a case where the design value of the cleavage position is 10 μm and the window region length is 20 μm in a state where the maximum error occurs on the positive side. As a result, an optical transmitter having a sufficient margin for required performance of high output and high quality transmission characteristics is designed even for an unavoidable error of a cleavage position in a manufacturing process. The failure rate of the AXEL chip can be reduced, the yield can be improved, and the manufacturing cost can be reduced.

Hereinafter, a more specific configuration and effect of the optical transmitter of the present disclosure will be described in detail together with examples.

Example 1

The optical transmitter of the present example can generate a modulated signal of 25 Gbit/s, and aims to increase the modulated optical output of the AXEL to +9 dBm or more in order to correspond to a high-loss budget optical communication system. The modulated optical output of the current typical AXEL designed for high output is approximately +10 dBm.

Figure 14:
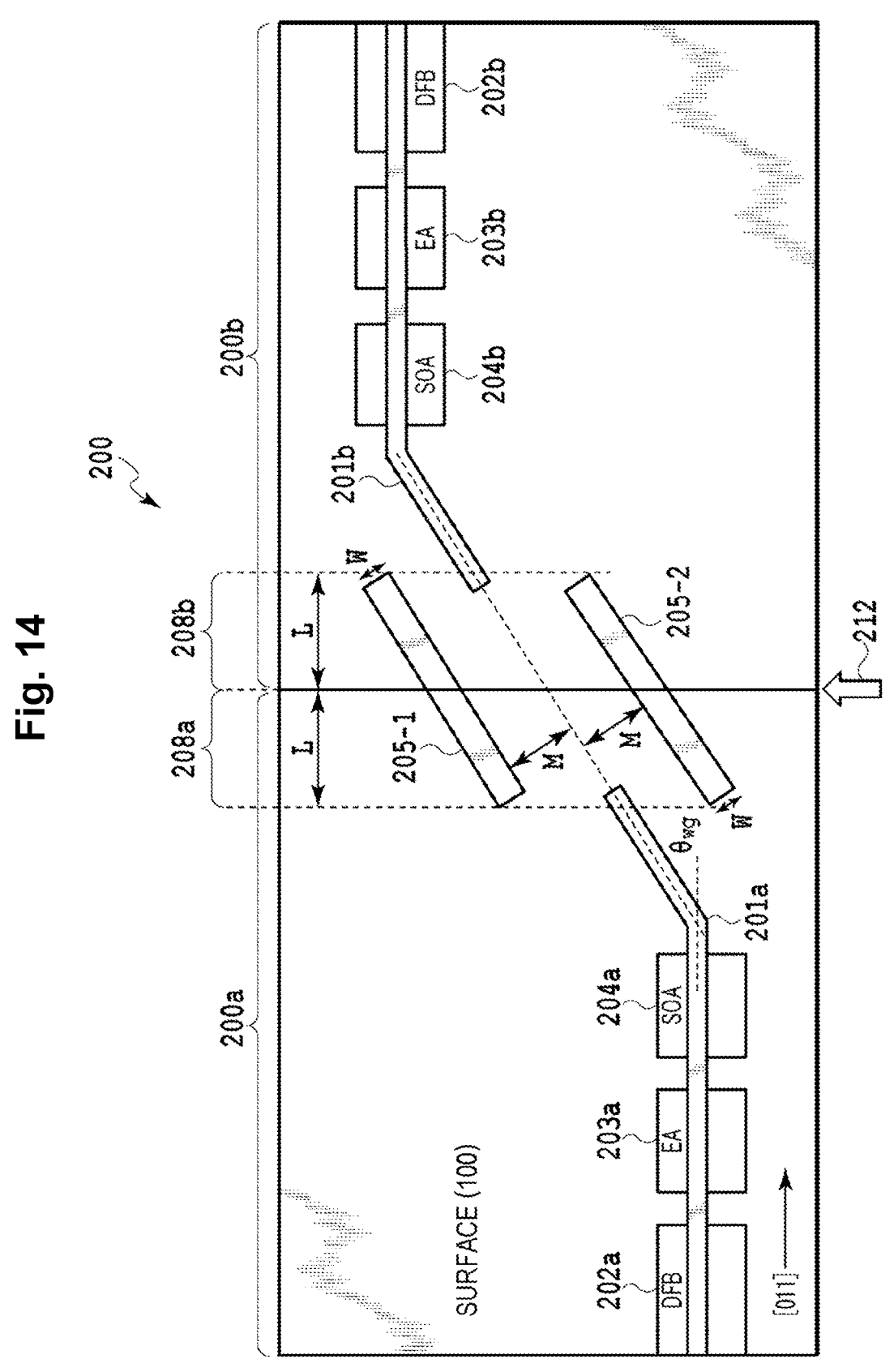
FIG. 14 is a diagram illustrating a schematic configuration of a window structure portion of an optical transmitter of Example 1.

FIG. 14 is a diagram illustrating a schematic configuration of an optical transmitter of Example 1. FIG. 14 is a top view of the substrate surface of the chip, and illustrates a chip 200 including two adjacent AXELs 200a and 200b before being separated in order to describe the process of forming the emission edge face by cleavage. One AXEL 200a is a monolithic integrated element including a DFB laser 202a having a length of 300 μm, an EA modulator 203a having a length of 150 μm in front of the DFB laser, and an SOA 204a having a length of 200 μm. The three regions are connected by an optical waveguide 201a, and a buried heterostructure using semi-insulating InP capable of obtaining a high heat dissipation effect and a current confinement effect is adopted. In order to obtain a sufficient reflection suppressing effect, the AXEL 200a has a bent waveguide part at the tip end of the optical waveguide 201a and a window region 208a to the cleavage scheduled surface 212. Another adjacent AXEL 200b also overlaps the AXEL 200a and has the same shape when rotated by 180 degrees at the intersection of the cleavage scheduled surface 212 and the optical axis.

The AXEL chip is formed on a surface (100) of the InP substrate, and the DFB laser 202a is disposed to output light in a substrate orientation direction. The light from the DFB laser 202a passes through the EA modulator 203a and the SOA 204a on the same optical axis, changes the propagation direction by the bent waveguide to have an angle of $\theta_{wg}$ with respect to the crystal orientation [011], and reaches the waveguide end. In the present example, $\theta_{wg}$ is set to 5° as the bending angle at which the sufficient reflection suppressing effect can be obtained. Note that the bending angle $\theta_{wg}$ is emphasized in FIG. 14. The light emitted from the waveguide end passes through the window region 208a having the length L, and then reaches the cleavage scheduled surface (emission edge face). In the adjacent AXEL chip 200b, the bent waveguide of the waveguide 201b is arranged such that the light emitted from the waveguide 201a faces each other on the same optical axis. The optical circuit elements of the two AXELs 200a and 200b have the same rotationally symmetric structure at the intersection of the cleavage scheduled surface and the optical axis. The two AXEL chips 200a and 200b in the state of FIG. 14 are separated into two chips by the cleavage process.

As described above, in the cleavage process, a position shift error of approximately #10 μm usually occurs. Therefore, the final window region length L is determined when the cleavage process is completed. In order to obtain a sufficient reflection suppressing effect, a window region length of 5 μm or more is required, and the window region length L is set to 15 μm in the present example in consideration of a position shift error in the cleavage process. Therefore, each of the ends of the waveguides 201a and 201b of the two opposing AXEL chips is arranged to be separated from each other by the window regions 208a and 208b having a length of 30 μm in the state before cleavage. In the optical transmitter of the present example, two simulated mesa structures 205-1 and 205-2 are provided to be substantially line-symmetric with respect to the optical axis. Note that the positions of the two simulated mesa structures 205-1 and 205-2 in the optical axis direction are slightly shifted due to the bending angle $\theta_{wg}$ of 5°. When the substrate surface is viewed, both of the two simulated mesa structures 205-1 and 205-2 have a width W, and are arranged parallel to the optical axis at a position away from the optical axis by M.

As can be intuitively understood from FIG. 14, since the simulated mesa structures 205-1 and 205-2 are arranged at positions sufficiently away from the optical axis extending the waveguide, the simulated mesa structures do not affect the light emitted from the waveguide end. The two simulated mesa structures are arranged to cross the cleavage scheduled surface 212, and exert a similar effect on two adjacent AXELs 200a and 200b facing each other. In the present example, the width W of the simulated mesa structure is designed to be 5 μm, and the distance M from the optical axis is designed to be 3 μm. As described in the relationship between the simulated mesa position and the amount of InP to be thickened in FIG. 12, by setting an appropriate width and position of the simulated mesa structure, the InP buried layers in the window regions 208a and 208b can be sufficiently thickened.

Next, a making procedure of the optical transmitter of the present example will be described. For making elements, an initial substrate was used in which a lower separated confinement heterostructure (SCH) layer, an active layer (MQW1) as a multiple quantum well layer, and an upper SCH layer were sequentially grown on a surface (100) of an n-InP substrate. The multiple quantum well layer includes six quantum well layers, and has an optical gain in an oscillation wavelength band of 1.3 μm. The initial growth substrate including this multiple quantum well layer is an optimized structure for high efficiency operation of DFB lasers.

In the procedure of making the optical transmitter, first, a part serving as the DFB laser and the SOA region is left with respect to the initial substrate described above, and the other active layer is selectively etched. Multiple quantum well layers (MQW2) for EA modulators are grown by butt joint regrowth. In the part serving as the SOA region, the core layer structure formed by the initial growth substrate remains as it is, and has the same layer structure as the layer structure of the DFB laser. The difference in the layer structure of the three regions of the DFB laser, the EA modulator, and the SOA is only the presence or absence of the diffraction grating. According to the above-described procedure, it is possible to suppress the number of times of regrowth and manufacture at low cost while having a structure in which a plurality of regions having different functions are integrated.

Next, the boundary part between the DFB laser and the EA modulator, the boundary part between the EA modulator and the SOA, and the region from the end of the SOA to the emission edge face are selectively etched again, and butt joint regrowth is performed to grow a bulk semiconductor serving as a core layer of the passive region. Subsequently, a diffraction grating that operates in an oscillation wavelength band of 1.3 μm is formed in a region of the DFB laser. In the resonator of the DFB laser, a diffraction grating is formed to output light in a substrate orientation direction. Thereafter, the p-InP cladding layer and the contact layer are grown again on the entire surface of the element by regrowth. In the present example, the cladding layer thickness is set to 2.0 μm such that the optical field propagating through the waveguide does not reach the interface between the upper cladding layer and the electrode. This cladding layer thickness is a common value as an optical semiconductor device in a normal communication wavelength band.

Next, a mesa structure of the part serving as a waveguide is formed. In this process, the end part of the waveguide of the window structure portion is also collectively made, and further, the simulated mesa structure in the window region introduced by the optical transmitter of the present disclosure is also made at the same time manufactured in the present process.

Figure 15:
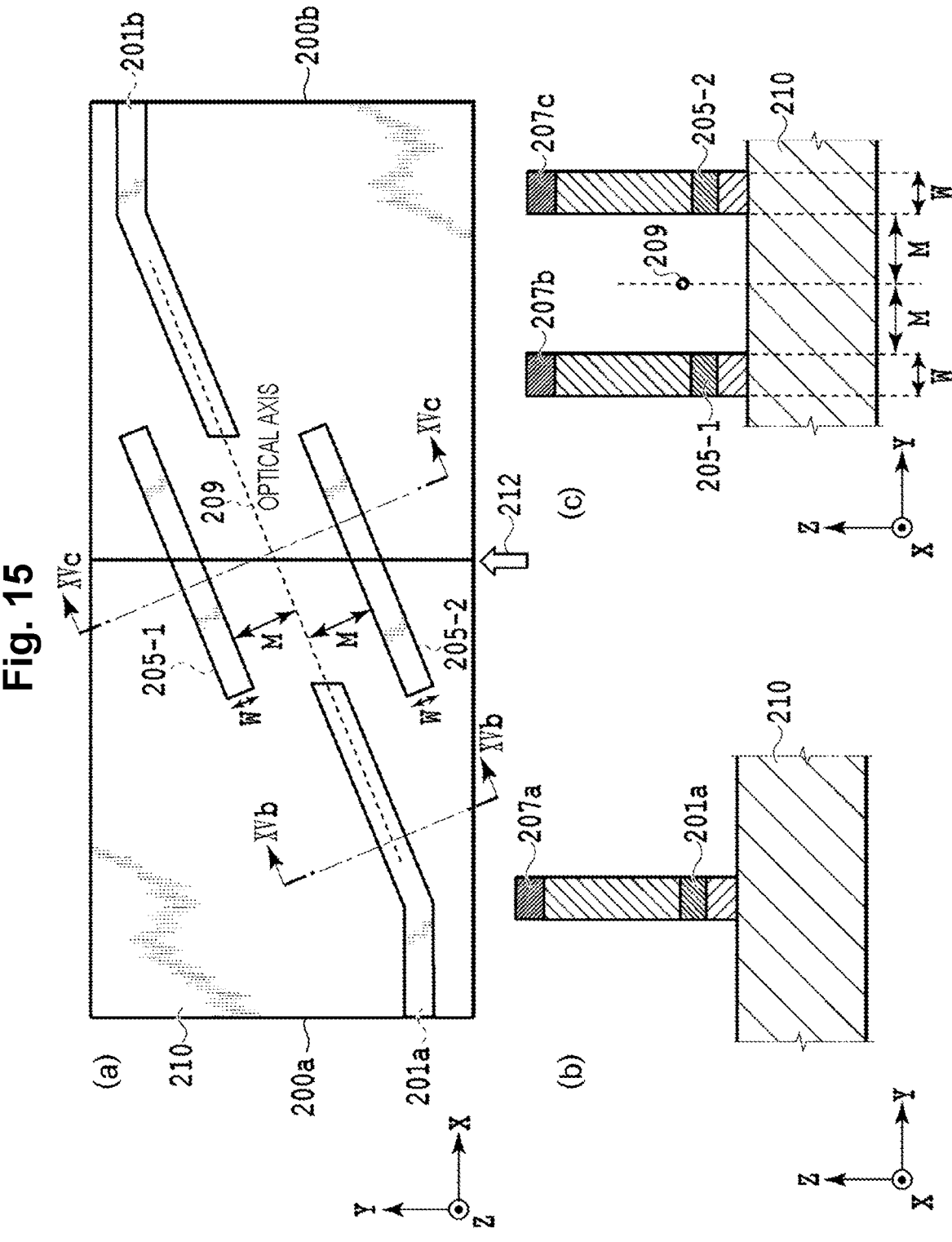
FIG. 15 is a diagram illustrating the vicinity of a window region before burying regrowth of the optical transmitter of Example 1.

FIG. 15 is a diagram illustrating the vicinity of a window region before burying regrowth of the optical transmitter of the present example. Similarly to the optical transmitter illustrated in FIG. 14, in a state before two adjacent AXELs 200a and 200b are separated by cleavage, a state before the InP buried layer is made is illustrated. FIG. 15(a) is a view illustrating a substrate surface before burying, and illustrates a cross-sectional view taken along a plane passing through the center of the core height of the waveguide and parallel to the substrate surface (x-y plane). FIG. 15(b) is a cross-sectional view taken along a cross section (y-z plane) perpendicular to the substrate surface passing through line XVb-XVb, and FIG. 15(c) is a cross-sectional view taken along a cross section (y-z plane) perpendicular to the substrate surface passing through line XVc-XVc. Furthermore, since the tip end portion of the waveguide is a bent waveguide, the cross sections of FIGS. 15(b) and (c) strictly indicate a plane slightly inclined ($\theta_{wg}$=5°) from the y-z plane.

In the processing of the mesa structure, the insulating film mask patterns 207a to 207c are formed in the waveguide part through which light propagates and the simulated mesa part of the window region, and the semiconductor is etched by dry etching to form the mesa structure. As illustrated in the cross-sectional views of FIGS. 15(b) and (c), in the waveguide part and the simulated mesa part through which light propagates, a semiconductor substrate 210 was etched to a depth of approximately 4 μm such that the core layer 201a formed in the butt joint process described above was completely exposed from the side wall. The core layer 201a of the waveguide and the core layers 205-1 and 205-2 of the simulated mesa are composed of semiconductors of the same composition grown in the butt joint process in the passive region described above. When each mesa structure of the waveguide part and the simulated mesa part was completed, the mesa structure was then buried with InP by burying regrowth while leaving the insulating film masks 207a to 207c.

Figure 16:
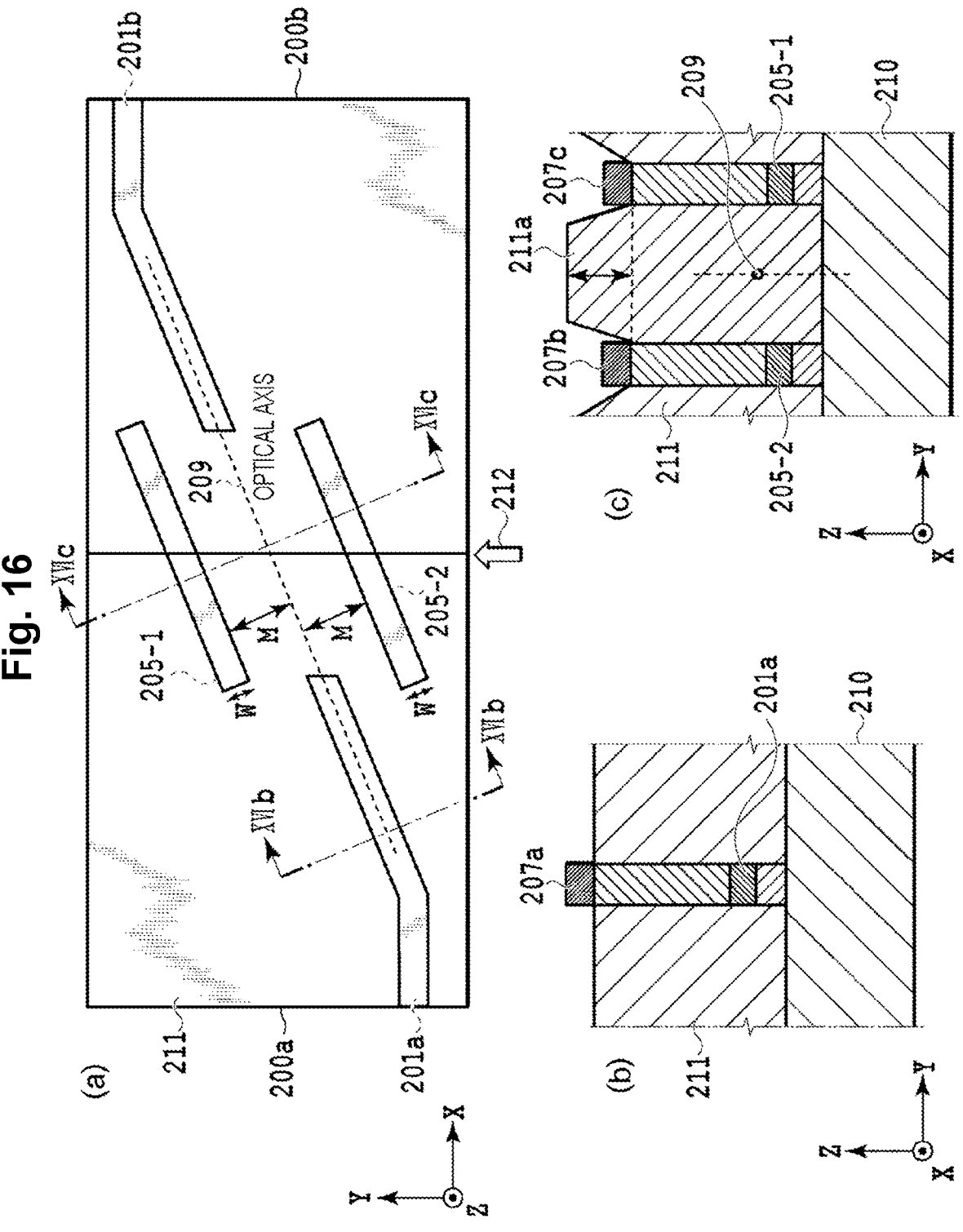
FIG. 16 is a diagram illustrating the vicinity of a window region after burying regrowth of the optical transmitter of Example 1.

FIG. 16 is a diagram illustrating the vicinity of a window region after burying regrowth of the optical transmitter of the present example. FIG. 16(a) is a view illustrating a substrate surface after burying an InP layer 211, and illustrates a cross-sectional view taken along a plane passing through the center of the core height of the waveguide and parallel to the substrate surface (x-y plane). FIG. 16(b) is a cross-sectional view taken along a cross section (y-z plane) perpendicular to the substrate surface passing through line XVIb-XVIb, and FIG. 16(c) is a cross-sectional view taken along a cross section (y-z plane) perpendicular to the substrate surface passing through line XVIc-XVIc. The difference from FIG. 15 is that the waveguide part and the simulated mesa part are buried in the InP buried layer 211.

The buried InP layer is a semi-insulating InP layer doped with Fe, and functions as a current block layer. The InP burying growth amount was adjusted such that the mesa structure of the waveguide was completely buried. When the growth amount of the semi-insulating InP layer is extremely small, the current blocking effect is not sufficiently exhibited, and a current is not efficiently injected into the DFB laser or the SOA unit, and sufficient output and efficient light amplification characteristics cannot be obtained. Conversely, when the growth amount of the semi-insulating InP layer is extremely large, abnormal growth occurs in which the regrown InP rides on the insulating film above the waveguide, and it becomes difficult to form electrodes of the DFB laser unit and the SOA unit. In order to secure a sufficient current confinement effect and flatness of the upper portion of the waveguide, it is necessary to set the growth amount of the InP layer at the time of burying growth.

In the present example, in the waveguide mesa, as illustrated in FIG. 16(b), the growth amount of the InP layer was adjusted such that the waveguide mesa was completely buried with the InP 211, and the InP 211 was as high as the waveguide mesa in the waveguide cross section. On the other hand, in the window region, as illustrated in FIG. 16(c), the exposed portion of the semiconductor 210 is narrowed by providing the simulated mesa structure, and the growth film thickness of InP is relatively larger than that of the waveguide mesa. By the effect of this thickening, the thickness of the buried InP layer between the two simulated mesa structures in the window region can be increased.

In the window region of the AXEL of the present example, the thickness of the semiconductor buried layer above the optical axis is 3.1 μm, which is much thicker than 2.0 μm in the window region of the AXEL of the related art.

When the growth amount of the InP layer in the window region becomes extremely large, abnormal growth in which InP rides on the simulated mesa structure may also occur. However, the simulated mesa structure itself does not have any function or role in the operation of the AXEL, and no problem occurs in the processing process. The simulated mesa structure functions as a structure only for adjusting the growth film thickness of the window region. In addition, the formation of the simulated mesa structure and the growth of the InP layer in the window region are performed by an etching process and a burying growth process for forming a waveguide. Therefore, with the introduction of the simulated mesa structure in the optical transmitter of the present disclosure, there is no increase or complication in the making process, and the making can be performed in the same manufacturing process of the AXEL of the related art.

Subsequent to the burying regrowth process in FIG. 16 described above, after the insulating film masks 207a to 207c are removed, the contact layer between the respective regions is removed by wet etching in order to electrically separate the respective regions of the DFB laser 202a, the EA modulator 203a, and the SOA 204a illustrated in FIG. 14. Subsequently, a P-side electrode for injecting a current through the contact layer on each region of the upper surface of the semiconductor substrate is formed. Thereafter, the InP substrate is polished to approximately 150 μm, an electrode is formed on the back surface of the substrate, and the process on the semiconductor wafer is completed.

Next to the process on the semiconductor wafer, the (011) crystal plane is formed by cleavage to make a semiconductor bar including a plurality of AXEL chips. Here, a general semiconductor chip cleavage process is used, and the cleavage positional accuracy is +10 μm or less. Using a semiconductor bar in which a plurality of chips made by the cleavage process are connected, AR coating is applied to a front emission edge face, and a high reflection (HR) coating is applied to an opposite rear edge face.

In order to confirm the effect of introducing the simulated mesa structure in the window region for the optical transmitter of Example 1 obtained through the series of making procedures described above, module mounting was performed together with the plurality of AXEL chips of the related art made in the same process, and evaluation was performed.

Figure 17:
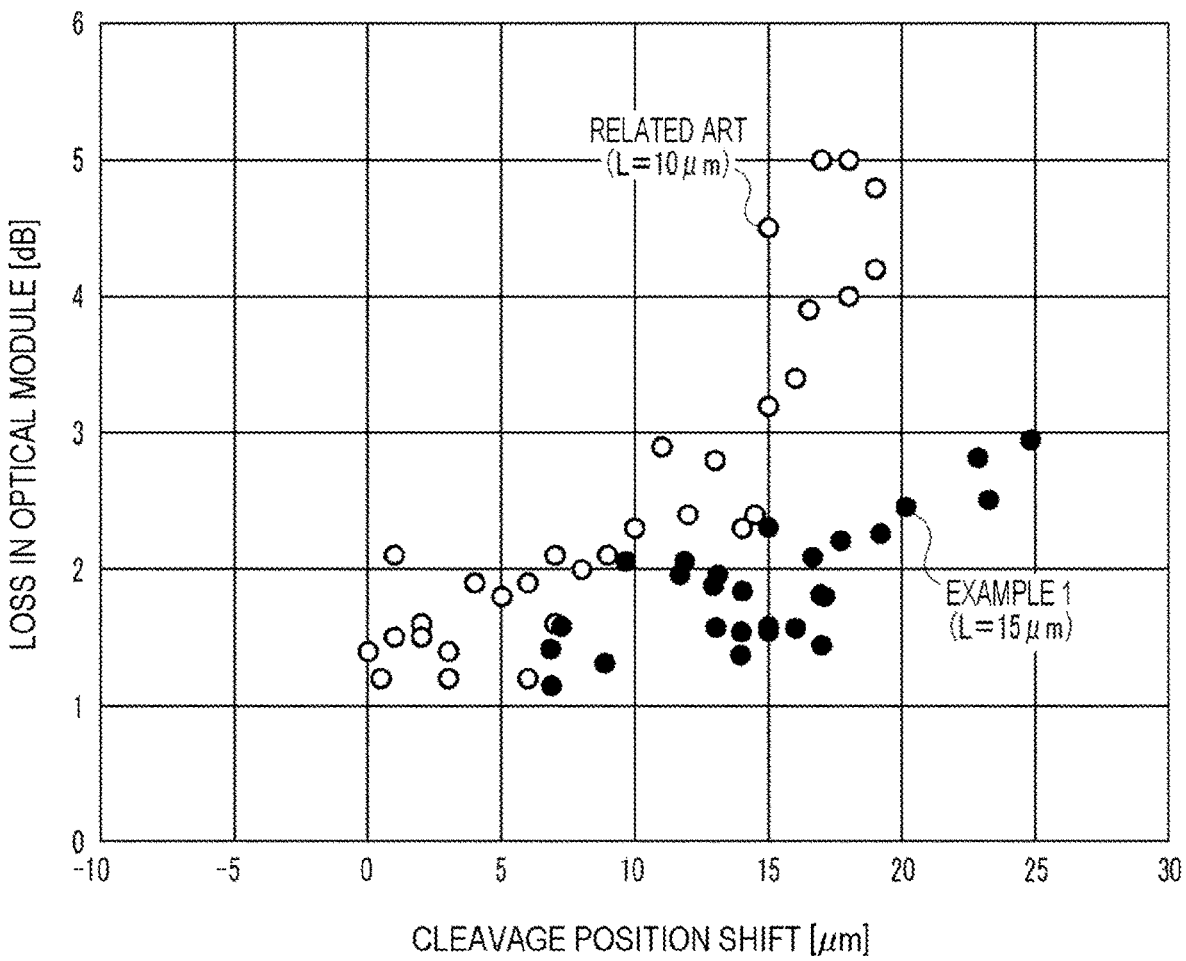
FIG. 17 is a diagram illustrating a relationship between cleavage position variation and loss in Example 1.

FIG. 17 is a diagram illustrating a relationship between cleavage position variation and optical loss in the AXEL of Example 1. FIG. 17 illustrates the result of the AXEL module according to the configuration of the related art and the result of the AXEL module of Example 1 at the same time. Before the module mounting, the window region length is evaluated as an actually measured value in all the AXEL chips in both of the one in the burying regrowth process of the related art and the one in Example 1, and the cleavage position shift amount on the horizontal axis in FIG. 17 is plotted by the actually measured value. The optical loss in the module on the vertical axis in FIG. 17 is calculated from the difference between the optical output level evaluated by the large-diameter PD in the AXEL chip before the module mounting and the fiber coupled optical output level after the module mounting. As a driving condition at the time of measuring the optical output level, the EA modulator was set to an unbiased state, and continuous-wave (CW) currents of 80 mA and 40 mA were applied to the DFB laser and the SOA, respectively. The operating temperature of the AXEL chip was 55° C. In FIG. 17, the results of evaluating the modules using the AXEL chip of the related art under the same conditions are also plotted. The AXEL chip of the related art is designed with a window region length L of 10 μm. The result of the optical loss in the AXEL module according to the configuration of the related art illustrated by the o (white circle) plot in FIG. 17 is the same as the plot data already illustrated in FIG. 9.

As described above, there is a limit to the positional accuracy of cleavage, and the window region length L varies. In the AXEL of the related art, the window region length of 10 μm is set as a design value, but the actually measured value of the window region length L varies in the range of 0 μm to 20 μm due to a position shift error of approximately +10 μm generated in the cleavage process. The optical loss in the module also fluctuates due to the variation in the window region length L, and the optical loss rapidly increases particularly when the window region length is 10 μm or more which is larger than the design value. The net optical output of the made AXEL chip is estimated to be approximately +12 dBm on average in terms of a modulated output $P_{avg}$. Therefore, when the optical loss increases by 3 dB or more when the module is mounted, the target optical output reference of the optical transmitter of +9 dBm cannot be achieved. This is a main factor that lowers the manufacturing yield in the AXEL module of the related art.

On the other hand, in the AXEL chip group of the present example in which the simulated mesa structure indicated by the ● (black circle) plot in FIG. 17 is introduced, the design value of the window region length L is set to 15 μm, and the actually measured value is also distributed in the range of 5 to 25 μm. Even when the window region length L in which the loss is rapidly increased in the related art exceeds 10 μm, it can be confirmed that the optical loss in the module is relatively small. Although a slight increase in optical loss is observed in the vicinity of the window region length L with the maximum error on the positive side of 25 μm, the optical loss is suppressed to 3 dB or less in any module of the present example. As can be seen from the results of the optical loss illustrated in FIG. 17, by introducing the simulated mesa structure, the AXEL module in which the variation in the optical loss is unavoidable can also be manufactured at a high yield. The yield of the module by the chip having the window structure portion of the related art was approximately 40% with respect to the target value +9 dBm or more of the optical output at the time of modulation. On the other hand, in the module using the chip having the simulated mesa structure of the present example, the manufacturing yield was approximately 75%, and it was possible to dramatically improve the manufacturing yield to almost twice the related art.

Finally, modulation characteristics were evaluated at 25 Gbit/s by using the made AXEL module, and the operation quality of the optical transmission signal was confirmed. As a modulated signal, NRZ, pseudo-random binary sequence (PRBS $2^{31}$–1) was used. Comparisons were made with the laser current value set to 80 mA and the applied voltage to the EA modulator set to −1.5 V for all AXELs. The drive current of the SOA was set to 70 mA. In the optical transmitter of the present example, a dynamic extinction ratio of 9.1 dB was obtained from the evaluation of the EYE waveform at a data rate of 25 Gbit/s.

Figure 18:
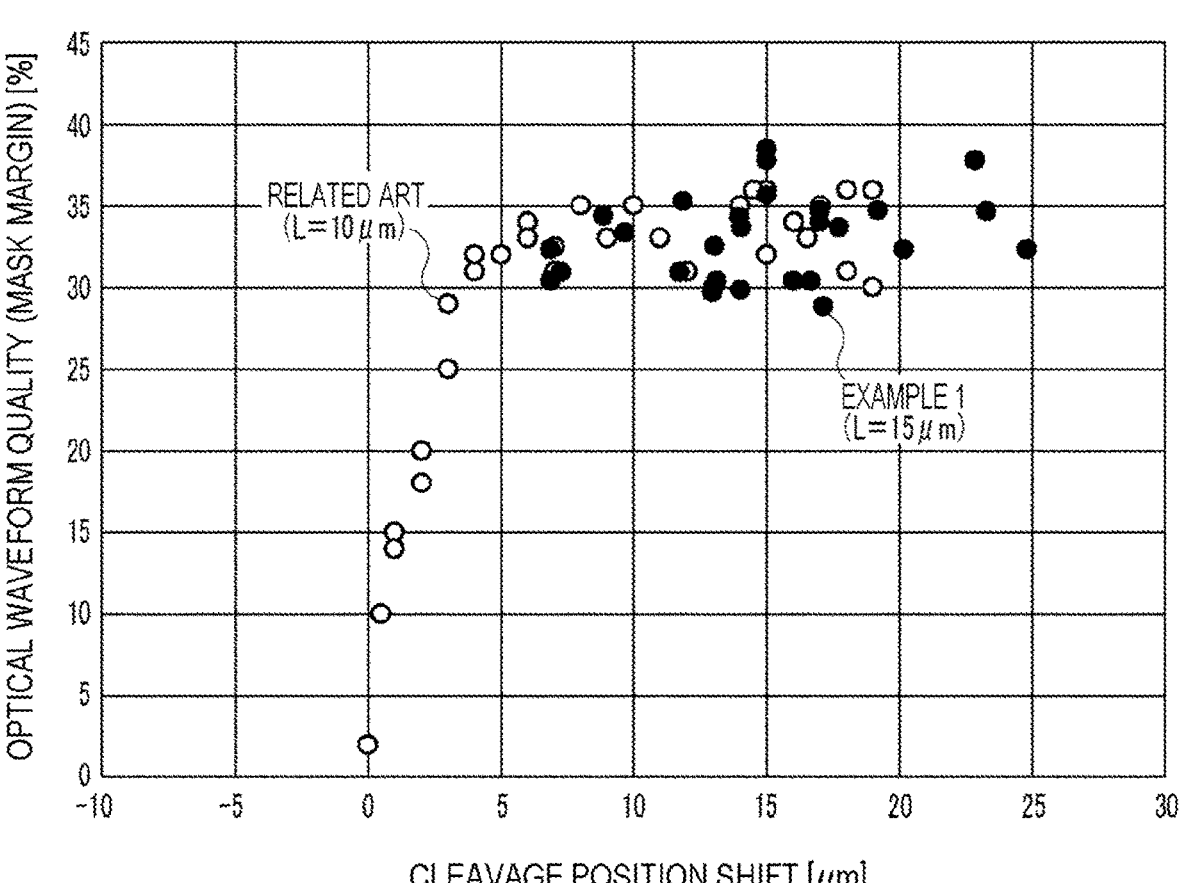
FIG. 18 is a diagram illustrating a relationship between cleavage position variation and optical waveform quality in Example 1.

FIG. 18 is a diagram illustrating a relationship between cleavage position variation and optical waveform quality in the AXEL of Example 1. The horizontal axis indicates a shift amount (μm) of the actual cleavage position of the AXEL chip, and the vertical axis indicates the mask margin (%) of the optical transmission signal waveform from the optical transmitter module using the chip. The relationship between the cleavage position shift amount and the mask margin (%) of the EYE waveform of the related art illustrated in FIG. 5 is exactly the same. ○ (white circle) plot by the AXEL of the configuration of the related art illustrated in FIG. 18 is the same as the data plot of the graph illustrated in FIG. 5. ● (black circle) plot by the AXEL of the configuration of the present example illustrates the mask margin of the EYE waveform for exactly the same sample as the sample illustrating the optical loss in FIG. 17.

As is apparent from the relationship of the graph of FIG. 18, in the AXEL of the present example mounted as a module, a stable mask margin of 30% or more is obtained regardless of the cleavage position shift amount. The value of the mask margin is on the same level as that of the sample in which the good quality is obtained in the module-mounted AXEL of the related art. In the optical transmitter into which the simulated mesa structure of the present example is introduced, it is not confirmed that the mask margin is lowered, and the waveform quality of the optical signal is not deteriorated, and it is apparent that the manufacturing yield can be significantly improved.

As a result of evaluating the transmission characteristics of 40 km by the single mode fiber using the operating conditions of the AXEL module described above, it has been confirmed that error-free transmission falling below the bit error rate $10^{-12}$ is performed. From the above results, in the optical transmitter in which the simulated mesa structure is introduced in the window region, it has been confirmed that the manufacturing yield of the optical transmission module is dramatically improved without deteriorating the module performance due to the variation in the cleavage position as in the configuration of the related art.

Example 2

In Example 1 described above, a basic configuration example of the optical transmitter (AXEL) in which two simulated mesa structures are introduced in the window region is illustrated, and the effects of achieving both the resistance to the position shift of the cleavage surface and the quality of the optical output level and the transmission waveform and improving the yield in the manufacturing process have been described. The simulated mesa structure in the window region is not limited to one including two simulated mesas on both sides of the optical axis of the output waveguide as illustrated in Example 1, and various variations are possible. In the present example, an example will be described in which a simulated mesa structure is introduced into a chip design capable of increasing the number of products from one wafer. In the example of the optical transmitter described below, three simulated mesa structures are introduced in the window region in the 1.5 μm band AXEL chip.

Figure 19:
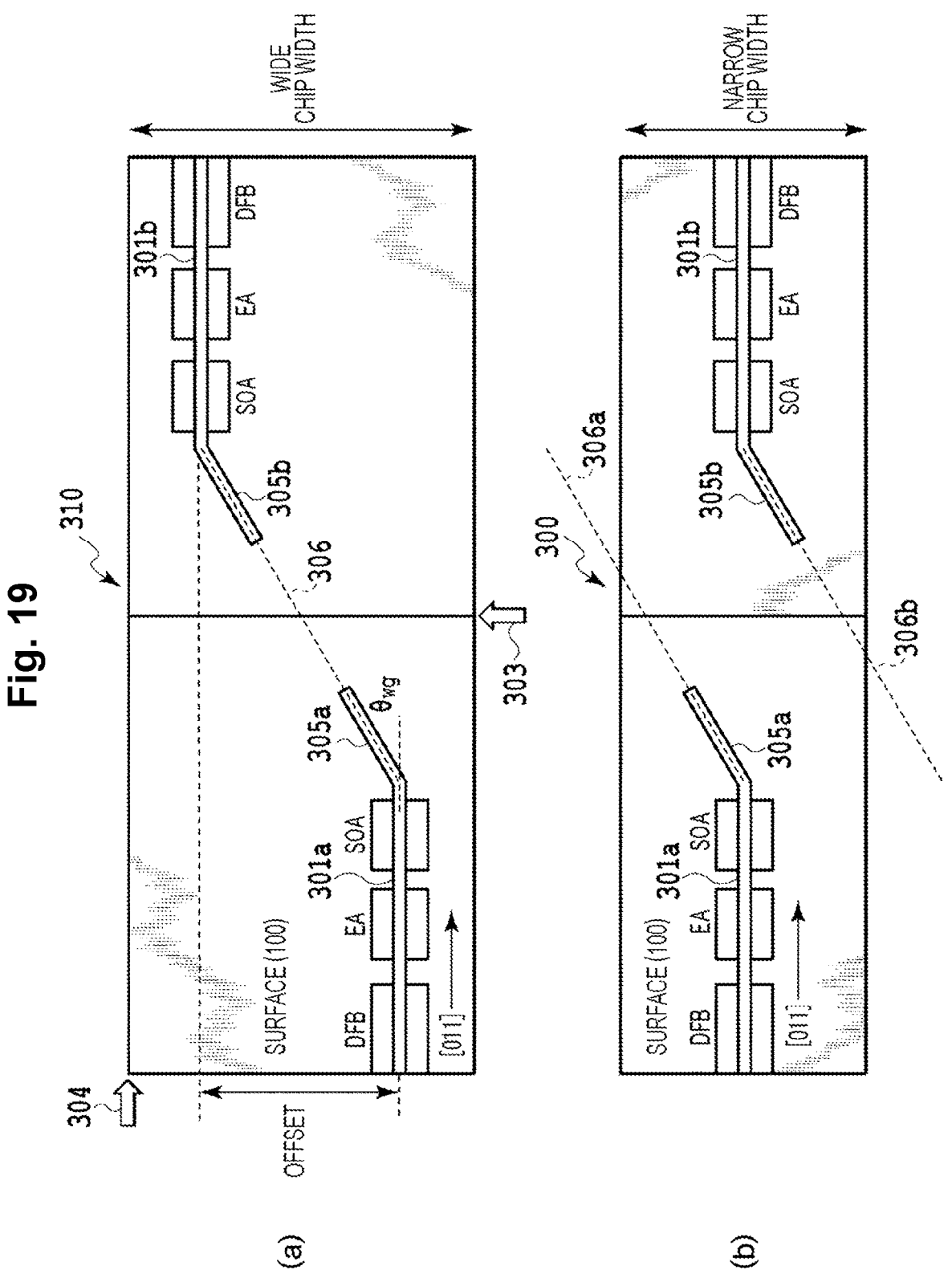
FIG. 19 is a diagram illustrating arrangement of optical circuit elements of the optical transmitters of Examples 1 and 2 in comparison.

FIG. 19 is a diagram illustrating an arrangement example of optical circuit elements of the AXEL chip of Example 2. FIG. 19 illustrates two AXEL chips including a window region with a cleavage scheduled surface interposed therebetween. FIG. 19(a) illustrates a schematic arrangement of optical circuit elements of the chip 310 of Example 1, and FIG. 19(b) illustrates a schematic arrangement of optical circuit elements of a chip 300 of the present example. Each chip includes a DFB laser, an EA modulator, and an SOA, and includes a main waveguide 301a passing through these optical circuit elements. The optical axis of a bent waveguide 305a at the tip end portion of a main waveguide 301a is inclined by an inclination angle ($\theta_{wg}$) with respect to the optical axis of the main waveguide 301a. Therefore, after cleavage, the light emitted from the bent waveguide 305a is inclined by an inclination angle ($\theta_{wg}$) from a direction perpendicular to a cleavage surface 303 and emitted from the edge face of the chip. Note that, in FIG. 19, the simulated mesa structure is not drawn for description.

In the optical transmitter of Example 1, as illustrated in FIG. 19(a), the optical circuit element is arranged such that optical axes 306 of the two bent waveguides 305a and 305b facing each other on the cleavage scheduled surface 303 match each other in the two adjacent AXELs of the chip 310 in the pre-cleavage state. In the arrangement of the optical circuit elements in FIG. 19(a), in the substrate of the surface (100) on which the optical circuit is formed, a large offset occurs in the arrangement of the DFB laser and the like having the waveguide in the substrate crystal orientation (011) direction in the direction along the cleavage surface 303 serving as the emission edge face. From the viewpoint of securing a margin of a cleavage position of a side wall 304 parallel to the main waveguide 301a of the chip 310 and an electrode having a sufficient area, it is desirable that the region of the DFB laser, the EA modulator, or the like is arranged at the chip center as far as possible from the side wall 304. Therefore, in the arrangement of the optical circuit elements as in FIG. 19(a), it is necessary to design the chip width (vertical direction in the drawing) to be relatively large. When such an optical circuit element is arranged in a general AXEL chip, a chip width of at least approximately 300 μm is required.

On the other hand, in the optical transmitter of the present example illustrated in FIG. 19(b), the optical circuit elements are arranged such that the optical axes 306a and 306b of the emitted light of the two adjacent AXEL chips do not match each other. As a result, the waveguide region in the substrate crystal orientation (011) direction such as the DFB laser is arranged near the center of the chip, and the chip width can be further narrowed.

When the structure in which the optical circuit element is arranged to reduce the chip width is adopted as illustrated in FIG. 19(b), a problem occurs in the simulated mesa structure of Example 1. In the optical transmitter of Example 1, the two simulated mesa structures were arranged on both sides of the optical axis on the extension of the bent waveguide to cross the cleavage scheduled position. In the case of the arrangement of the optical circuit element in which the two optical axes 306a and 306b of the adjacent AXEL do not match each other as illustrated in FIG. 19(b), the two simulated mesa structures cannot be arranged in this manner. In the present example, a structure in which three simulated mesa structures are arranged at equal intervals for two AXELs arranged adjacent to each other on the cleavage scheduled surface is adopted.

Figure 20:
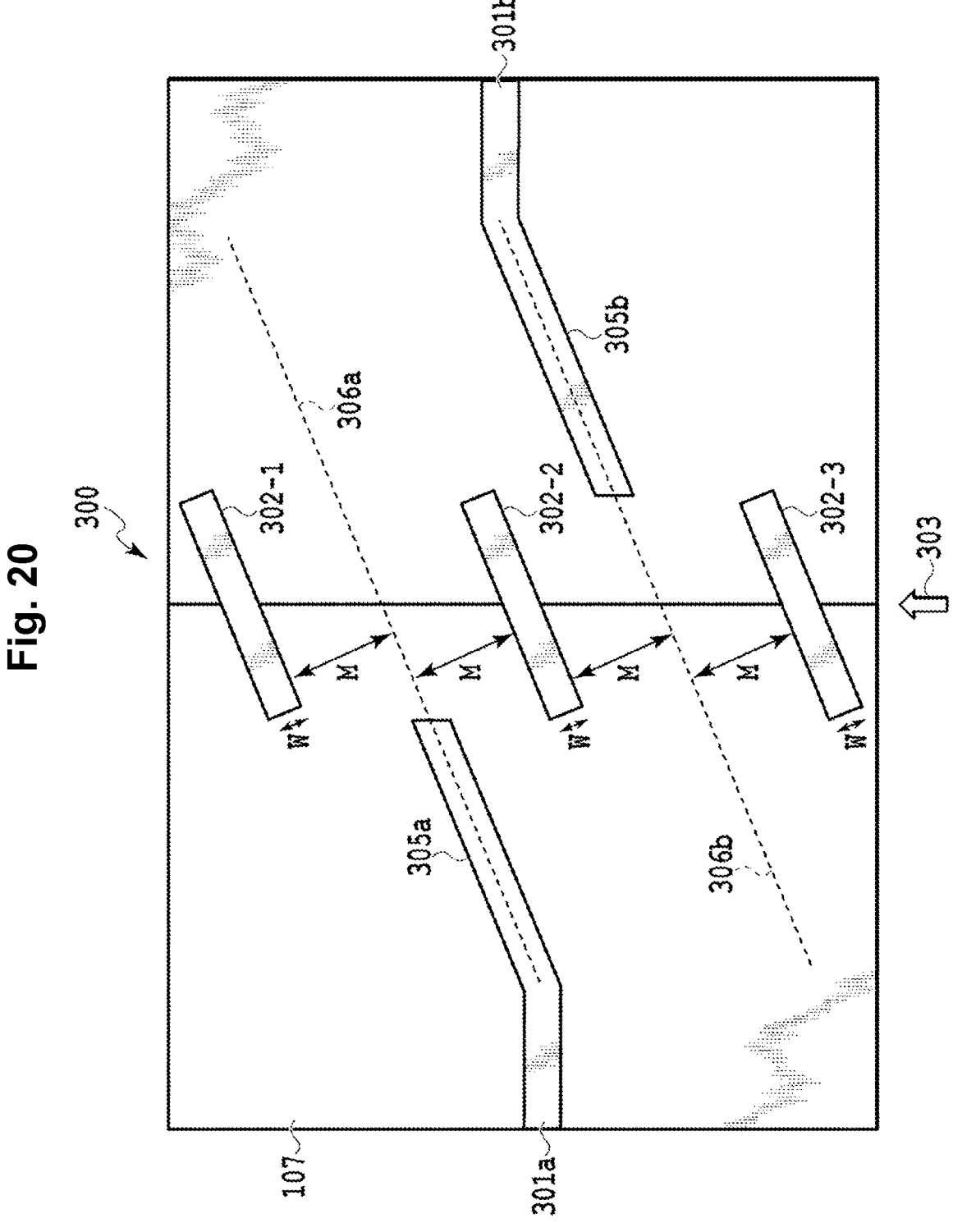
FIG. 20 is a diagram illustrating a schematic configuration of a window structure portion before cleavage of an optical transmitter of Example 2.

FIG. 20 is a diagram illustrating a schematic configuration of a window structure portion before cleavage of an optical transmitter of Example 2. FIG. 20 is a view of the substrate surface of the chip 300 before cleavage of two adjacent AXELs, and more precisely, is a cross-sectional view taken parallel to the substrate surface passing through the waveguide core in the thickness direction of the substrate. In each AXEL waveguide, the optical axes 306a and 306b of the bent waveguides are shifted as illustrated in FIG. 19(b).

In the optical transmitter of the present example, all of the three simulated mesa structures 302-1 to 302-3 are arranged to be separated from the optical axis by the distance M parallel to the optical axes of each of the bent waveguides 305a and 305b to cross the cleavage surface 303. The simulated mesa structure 302-2 in the middle of the three simulated mesa structures is disposed at a position away from the optical axes 306*a* and 306*b* of both of the two adjacent AXEL chips by the distance M. Two simulated mesa structures at both ends among the three simulated mesa structures are also similarly arranged to be separated by the distance M from the optical axes of each AXEL chip. The width W of any simulated mesa structure is common.

Therefore, in the optical circuit of the present disclosure, the waveguide 301*a* includes the bent waveguide portion 305*a* having the bending angle $\theta_{wg}$ toward the end, and the optical axis 306*a* is an extension line of an optical axis of the bent waveguide portion, and the plurality of simulated mesas include two simulated waveguides 302-1 and 302-2 arranged on both sides of the optical axis 306*a*, and the third simulated waveguide 302-3 separated by the distance 2M from one simulated waveguide 302-2 opposite to the bending of the bent waveguide portion 305*a* of the two simulated waveguides parallel to the two simulated waveguides.

By arranging the simulated mesa structure as shown in FIG. 20, the effect of increasing the film thickness of the window region InP can be obtained as in Example 1. At the same time, as described with reference to FIG. 19, it is possible to downsize the AXEL chip and increase the yield of chip manufacturing in the wafer.

The process of making the AXEL chip of the present example is substantially the same as the process of making the AXEL chip of Example 1 described above. The lengths of the DFB laser, the EA modulator, and the SOA in the AXEL chip are 350 μm, 200 μm, and 200 μm, respectively. The diffraction grating formed in the DFB laser has a period designed to have an oscillation wavelength of 1.55 μm. As illustrated in FIG. 20, three simulated mesa structures are arranged in the window region in the vicinity of the emission end, and the InP buried layer in the window region is thickened. The distance M from the optical axis to the end of the simulated mesa structure was set to 4 μm, and the width W of the simulated mesa was set to 7 μm.

As is apparent from FIG. 20, the distance M from the optical axis to the simulated mesa structure is uniquely determined when the waveguide arrangement of the two adjacent AXEL chips is determined. On the other hand, since the width W of the simulated mesa structure can be designed to any value, the InP film in the window region can be adjusted to a desired thickness by appropriately setting the width W. As compared with the optical transmitter of Example 1, in the present example, the distance M from the optical axis to the simulated mesa structure is increased. Due to the simulated mesa structure, it is expected that the degree of reduction of the semiconductor exposed part serving as the base of the deposition of the InP layer is smaller than that in Example 1, and the effect of thickening the InP layer in the window region is reduced.

In the present example, by increasing the width W of the simulated mesa structure, the effect of increasing the thickness of InP equivalent to that in Example 1 has been successfully obtained. In the actually made AXEL chip, the cladding layer thickness on the optical axis in the window region was confirmed to be 3.0 μm, and even when the window region length L was designed to be 15 μm, the effect of improving the yield can be obtained without increasing the optical loss in the window region. Furthermore, in the optical transmitter of the present example, the chip width can be narrowed from 300 μm of the related art to 200 μm. As a result, the number of AXEL chips that can be made on the same wafer has been successfully increased by 50%.

Subsequently, the basic characteristics of the made AXEL chip of Example 2 were evaluated. At an operating temperature of 55° C., currents of 80 mA and 100 mA were applied to the DFB laser and the SOA, respectively, and an applied voltage of −1.5 V was applied to the EA modulator. When modulation is performed with an NRZ signal of 10 Gbit/s at an amplitude voltage $V_{pp}$=1.5 V, a high optical output level reaching a maximum of +11 dBm as an optical output at the time of modulation is confirmed. As a result of evaluating the yield when the AXEL chip having the simulated mesa structure of the present example was modularized, it was confirmed that when the target value of the optical output at the time of modulation was set to +10 dBm or more, an extremely good result was obtained in which the manufacturing yield of the module was approximately 60%.

In the above-described examples, all the simulated mesa structures are waveguide mesas having a rectangular shape when the substrate surface is viewed. However, in order to thicken the buried InP layer between the two simulated mesa structures, it is only necessary to reduce the area and space serving as the base of the deposition of the InP layer in the window region. Therefore, the shape of the simulated mesa structure may expand in a tapered shape from the waveguide end toward the emission edge face, for example. Even in this case, the distance M between the optical axis and the simulated mesa structure is preferably constant throughout the window region such that the buried InP layer between the two simulated mesa structures in the window region is thickened uniformly. In addition, it is desirable that the two simulated mesa structures have a line-symmetric shape with respect to the optical axis.

In the above description, an example in which the waveguide of the DFB laser is configured to output light in the direction of [011] has been described, but the substrate orientation may be
[0 T̄ T̄].

As described above in detail, the optical transmitter of the present disclosure in which the simulated mesa structure is introduced into the window region in the vicinity of the cleavage surface of the chip can achieve both the high output and the high quality transmission characteristics of the AXEL. A sufficient margin can be provided in the window region length L even for the position shift at the time of cleavage, the yield of the optical transmitter module can be greatly improved, and the cost can be reduced.

INDUSTRIAL APPLICABILITY

The present invention can be used for optical communication.

The invention claimed is:

1. An optical circuit integrating a semiconductor laser and a semiconductor optical amplifier (SOA) on a substrate, the optical circuit comprising:
  a waveguide being optically connected to the SOA and terminating inside of the substrate from an edge face; and
  a window region through including a plurality of simulated mesas configured parallel to an optical axis from an end of the waveguide to the edge face and being buried by a bulk semiconductor except for the plurality of simulated mesas, each of the plurality of simulated mesas being separated from the optical axis by a distance M,
  wherein
  light emitted from the end of the waveguide propagates to the edge face,
  the edge face is a cleavage surface,
  the waveguide includes a bent waveguide portion having a bending angle $\theta_{wg}$ toward the terminal end, and the optical axis is an extension line of an optical axis of the bent waveguide portion, and the plurality of simulated mesas comprising:

two simulated waveguides that are arranged on both sides of the optical axis; and a third simulated waveguide that is separated by a distance 2M from one simulated waveguide opposite to a bending of the bent waveguide portion of the two simulated waveguides and being parallel to the two simulated waveguides.

2. The optical circuit according to claim 1, wherein each simulated mesa has a same layer structure as the waveguide.

3. The optical circuit according to claim 1, wherein each simulated mesa has a mesa structure with a width W.

4. The optical circuit according to claim 1, wherein the light is incident on the edge face to be inclined by the bending angle $\theta_{wg}$ from a direction perpendicular to the edge face.

5. The optical circuit according to claim 1, wherein the semiconductor laser is a distributed feedback laser (DFB laser) in which an electric field absorption modulator is integrated, the optical circuit is an optical transmitter, and the waveguide is a passive waveguide including a core layer having a band gap wavelength shorter than an oscillation wavelength of the DFB laser.

6. The optical circuit according to claim 5, wherein, the DFB laser, the electric field absorption modulator, and the SOA are formed on a surface (100) of an InP substrate, and an optical axis of the DFB laser is parallel to a substrate crystal orientation [0 1 1] or [0 $\bar{1}$ $\bar{1}$].

7. The optical circuit according to claim 1, wherein the distance M falls within a range of 2 μm<M<6 μm, the width W of each simulated mesa falls within a range of 1 μm<W, and a distance L between the terminal end and the edge face falls within a range of 5 μm<L<25 μm.

* * * * *